(12) United States Patent
Garbi et al.

(10) Patent No.: US 11,239,657 B2
(45) Date of Patent: Feb. 1, 2022

(54) AC SWITCHING ARRANGEMENT

(71) Applicant: GridON Ltd., Givatayim (IL)

(72) Inventors: Uri Garbi, Givatayim (IL); Dvir Landwer, Givatayim (IL); Alex Oren, Givatayim (IL); Vladimir Rozenshtein, Givatayim (IL)

(73) Assignee: GridON Ltd., Givatayim (IL)

( * ) Notice: Subject to any disclaimer, the term of this patent is extended or adjusted under 35 U.S.C. 154(b) by 0 days.

(21) Appl. No.: 16/496,082

(22) PCT Filed: Mar. 21, 2018

(86) PCT No.: PCT/IL2018/050323
§ 371 (c)(1),
(2) Date: Sep. 20, 2019

(87) PCT Pub. No.: WO2018/173054
PCT Pub. Date: Sep. 27, 2018

(65) Prior Publication Data
US 2020/0028359 A1 Jan. 23, 2020

(30) Foreign Application Priority Data
Mar. 21, 2017 (GB) .................. 1704482

(51) Int. Cl.
*H02H 9/06* (2006.01)
*H02J 3/14* (2006.01)
(Continued)

(52) U.S. Cl.
CPC .............. *H02H 9/06* (2013.01); *H01H 71/10* (2013.01); *H02H 9/04* (2013.01); *H02J 3/14* (2013.01);
(Continued)

(58) Field of Classification Search
CPC ........... H02H 9/06; H02H 9/00; H02H 9/005; H02H 9/04; H02H 8/087; H02H 9/001;
(Continued)

(56) References Cited

U.S. PATENT DOCUMENTS 3,466,503 A * 9/1969 Goldberg ................. H01H 9/46
361/12
5,216,352 A 6/1993 Studtmann et al.
(Continued)

FOREIGN PATENT DOCUMENTS

AU 2017202026 A1 4/2017
CN 105206449 A 12/2015
(Continued)

OTHER PUBLICATIONS

UKIPO, Combined Search and Examination Report for corresponding GB Patent Application No. 1704482.7, dated Sep. 15, 2017, 5 pages.
(Continued)

*Primary Examiner* — Danny Nguyen
(74) *Attorney, Agent, or Firm* — NK Patent Law

(57) ABSTRACT

An AC switching arrangement is provided with an energy transfer arrangement connected in parallel with a switching mechanism. The energy transfer arrangement comprises a capacitance arrangement and a diode arrangement. The switching mechanism normally closed in a first state, and on reception of a signal indicating the second state, the switching mechanism is arranged to open. When the switching mechanism is in the second state, the diode arrangement is arranged in each AC half cycle to enable energy (source energy, stored inductance energy, etc.) to transfer from the grid to the capacitance arrangement but to prevent energy transfer from the capacitance arrangement back to the grid.

5 Claims, 20 Drawing Sheets

(51) Int. Cl.
*H01H 71/10* (2006.01)
*H02H 9/04* (2006.01)
*H02H 9/00* (2006.01)
*H01H 9/54* (2006.01)

(52) U.S. Cl.
CPC ............... *H01H 9/542* (2013.01); *H02H 9/00* (2013.01); *H02H 9/001* (2013.01); *H02H 9/005* (2013.01)

(58) Field of Classification Search
CPC ........... H02J 3/14; H01H 71/10; H01H 9/542; H01H 9/548
USPC .................................................. 361/2–13, 115
See application file for complete search history.

(56) References Cited

U.S. PATENT DOCUMENTS

| | | | |
|---|---|---|---|
| 5,216,532 A | 6/1993 | Taylor | |
| 8,138,440 B2* | 3/2012 | Onufriyenko | H01H 73/045 218/154 |
| 9,065,326 B2* | 6/2015 | Hafner | H02M 1/092 |
| 9,331,476 B2 | 5/2016 | Tekletsadik et al. | |
| 2005/0146814 A1* | 7/2005 | Sellier | H01H 3/222 361/8 |
| 2011/0292551 A1* | 12/2011 | Zheng | H01H 9/541 361/8 |
| 2014/0078622 A1* | 3/2014 | Crane | H02H 3/087 361/8 |
| 2014/0168830 A1 | 6/2014 | Vangool et al. | |
| 2015/0002977 A1* | 1/2015 | Dupraz | H01H 9/542 361/115 |
| 2015/0036253 A1* | 2/2015 | Wang | H02M 1/34 361/91.7 |
| 2015/0055263 A1 | 2/2015 | Tekletsadik et al. | |

FOREIGN PATENT DOCUMENTS

| | | |
|---|---|---|
| CN | 105375454 A | 3/2016 |
| CN | 106099878 A | 11/2016 |
| CN | 106786444 A | 5/2017 |
| CN | 107039959 A | 8/2017 |
| EP | 3104486 A1 | 12/2016 |
| GB | 2517742 A | 3/2015 |
| GB | 2520529 A | 5/2015 |
| JP | H11111123 A | 4/1999 |
| JP | 2000032757 A | 1/2000 |
| WO | 2013071980 A1 | 5/2013 |
| WO | 2014053554 A1 | 4/2014 |

OTHER PUBLICATIONS

ISA/IL, International Search Report and Written Opinion for corresponding PCT Patent Application No. PCT/IL2018/050323, dated Jul. 15, 2018, 13 pages.
EPO, Extended European Search Report for corresponding EP Patent Application No. 18771349.0, dated Nov. 23, 2020, 6 pages.

* cited by examiner

AC SWITCHING ARRANGEMENT

CROSS REFERENCE TO RELATED APPLICATIONS

This application is a U.S. National Stage application of PCT Patent Application No. PCT/IL2018/050323 filed on Mar. 21, 2018, which claims priority to United Kingdom Patent Application No. 1704482.7 filed on Mar. 21, 2017, the entire content of all of which is incorporated by reference herein.

The present invention relates to an AC switching arrangement.

An electrical grid is an interconnected network for delivering electricity from suppliers to consumers.

Faults in electrical power systems cannot be avoided. Fault currents flowing from the sources to a location of the fault lead to high dynamical and thermal stresses being imposed on equipment e.g. overhead lines, cables, transformers and switch gears.

Conventional circuit breaker technology does not provide a full solution to selectively interrupting currents associated with such faults. The growth in electrical energy generation and consumption and the increased interconnection between networks leads to increasing levels of fault current. In particular, the continuous growth of electrical energy generation has the consequence that networks reach or even exceed the limits with respect to their short circuit withstand capability.

Short circuit currents are rising as transmission and distribution networks expand to address increasing energy demand and connectivity of power generation and intermittent energy sources. These may result in power disruptions, equipment damage and major outages, which have been estimated to cost billions of dollars per year.

The present invention sets out to provide an AC switching arrangement with improved performance compared to conventional arrangements.

According to a first aspect of the invention there is provided an AC switching arrangement for connection to an AC grid, the AC switching arrangement comprising: a first grid terminal connectable to a first node in the AC grid and a second grid terminal connectable to a second node in the AC grid; a switching mechanism connected in series between the first grid terminal and the second grid terminal, wherein the first switching mechanism includes a first switch, and wherein the first switch is closed in a first state and open in a second state; an energy transfer arrangement connected in parallel with the first switch, the energy transfer arrangement comprising a capacitance arrangement and a diode arrangement; wherein, on reception of a signal indicating the second state, the switching mechanism is arranged to open the first switch; wherein, when the first switch is in the second state, the diode arrangement is arranged in each AC half cycle to enable energy to transfer from the AC grid to the capacitance arrangement but to prevent energy transfer from the capacitance arrangement back to the AC grid.

The AC switching arrangement is arranged to interrupt the network current rapidly, before first fault current peak, and typically within 1-3 milliseconds. This enables the AC switching arrangement to act as a current limiting interrupter.

The AC switching arrangement may act as a current interrupter. In other embodiments, the AC switching arrangement may act as a current limiter (e.g. with a suitable parallel impedance).

It will be appreciated that the grid has an inductance that stores energy magnetically when current flows through it. On reception of a signal indicating a fault (i.e. a second state), the switching mechanism is arranged to open the first switch rapidly (e.g. within 5-50 microseconds), and the diode arrangement is arranged such that in each AC half cycle energy is transferred from the grid to the capacitance arrangement. Once the capacitance arrangement is charged above the network voltage and the stored energy in the grid is discharged, its associated diode of the diode arrangement stops conducting and prevents energy from being transferred back from the diode arrangement to the grid. Hence, the diode arrangement is arranged to ensure unidirectional flow of energy from the grid into the energy transfer arrangement, and to prevent energy from flowing back from the energy transfer arrangement into the grid.

In some embodiments, the capacitance arrangement comprises a first capacitance and a second capacitance and the diode arrangement comprises a first diode and a second diode, and the energy transfer arrangement comprises: a first energy transfer branch connected in parallel with the first switch comprising the first capacitance and the first diode, and a second energy transfer branch connected in parallel with the first switch comprising the second capacitance and the second diode, wherein the first diode is arranged to enable energy stored from the grid to be transferred to the first capacitance in one AC half cycle but to prevent energy transfer from the first capacitance back to the grid, and wherein the second diode is arranged to enable energy from the grid to be transferred to the second capacitance in the other AC half cycle but to prevent energy transfer from the second capacitance back to the grid.

When the switching mechanism of such embodiments opens, one of the first capacitance or the second capacitance will begin being charged, depending on the voltage phase angle. Once the first capacitance or the second capacitance is fully charged (the voltage may be higher than the grid voltage) the current will stop within that half cycle. Then in the next half cycle, the other of the first capacitance or the second capacitance will be charged and once fully charged (again the voltage may be higher than the grid voltage) the current will stop within that half cycle as well.

The first energy transfer branch operates in one AC half cycle and the second energy transfer branch operates in the next AC half cycle. Hence, the first energy transfer branch and the second energy transfer branch operate in the two AC half cycles. When the first switch is open, the first diode is arranged to enable energy stored in the grid to be transferred to the first capacitance in one AC half cycle but to prevent energy transfer from the first capacitance back to the grid. The second energy transfer branch is arranged in a similar way, with the second diode being arranged to enable energy stored in the grid to be transferred to the second capacitance in the next AC half cycle but to prevent energy transfer from the second capacitance back to the grid.

In some embodiments, the first diode and second diode are connected in series and have opposite polarities. In some embodiments, the first capacitance has a first terminal and a second terminal, and the second capacitance has a first terminal and a second terminal; wherein the anode of the first diode is connected to the first grid terminal and the cathode of the first diode is connected to the first terminal of the first capacitance or wherein the anode of the first diode is connected to the second terminal of the first capacitance and the cathode of the first diode is connected to the second grid terminal; and wherein the anode of the second diode is connected to the second grid terminal and the cathode of the second diode is connected to the first terminal of the second capacitance or wherein the anode of the second diode is connected to the second terminal of the second capacitance and the cathode of the second diode is connected to the first grid terminal.

In some embodiments, the first energy transfer branch further comprises a first parallel resistance connected in parallel with the first capacitance and/or the second energy transfer branch further comprises a second parallel resistance connected in parallel with the second capacitance.

In some embodiments, the first energy transfer branch further comprises a first series resistance connected in series with the first capacitance and/or the second energy transfer branch further comprises a second series resistance connected in series with the second capacitance.

In some embodiments, the first energy transfer branch further comprises a first arrester connected in parallel with the first capacitance and/or the second energy transfer branch further comprises a second arrester connected in parallel with the second capacitance.

In some embodiments, an arrester may be connected in parallel with the first capacitance and with the first series resistance (if present). In other embodiments, an arrester may be connected in parallel with the first capacitance and not with the first series resistance.

In some embodiments, an arrester may be connected in parallel with the second capacitance and with the second series resistance (if present). In other embodiments, an arrester may be connected in parallel with the second capacitance and not with the second series resistance.

In some embodiments, an arrester may be connected in parallel with the capacitance of each energy transfer branch as well as with the diode of the respective branch. In such embodiments, such arresters may also be connected in parallel with the series resistance (if present).

In some embodiments, the energy transfer arrangement comprises an energy transfer branch connected in parallel with the first switch comprising the capacitance arrangement and the diode arrangement.

In some embodiments, the capacitance arrangement comprises a capacitance having a first terminal and a second terminal, and the diode arrangement comprises first, second, third and fourth diodes, each having an anode and a cathode; wherein the anode of the first diode is connected to the first grid terminal and the cathode of the first diode is connected to the first terminal of the capacitance; wherein the cathode of the second diode is connected to the first grid terminal and the anode of the second diode is connected to the second terminal of the capacitance; wherein the anode of the third diode is connected to the second grid terminal and the cathode of the third diode is connected to the first terminal of the capacitance; wherein the cathode of the fourth diode is connected to the second grid terminal and the anode of the fourth diode is connected to the second terminal of the capacitance.

In some embodiments, the first, second, third and fourth diodes are arranged in a rectifier configuration.

In such embodiments, when the switching mechanism opens, the capacitance will begin being charged (not depending on the half cycle polarity). Once the capacitance is fully charged (the voltage may be higher than the grid voltage) the current flowing on the energy transfer branch will stop. Hence, when compared to the two branch embodiments mentioned above, such one branch embodiments can stop the current flow within one half cycle. Such one branch embodiments can be arranged to stop the current within 1-3 milliseconds.

In some embodiments, the switching mechanism comprises a first switch and a second switch connected in series, wherein the first and second switches are arranged to open and close at the same time; wherein the diode arrangement comprises first and second diodes, each having an anode and a cathode, and the capacitance arrangement comprises a capacitance having a first terminal and a second terminal, and wherein the anode of the first diode is connected to the first grid terminal and the cathode of the first diode is connected to the first terminal of the capacitance, and wherein the anode of the second diode is connected to the second grid terminal and the cathode of the second diode is connected to the first terminal of the capacitance; wherein the second terminal of the capacitance is connected to a node that is between the series connected first and second switches.

In some embodiments, the first and second switches respectively comprise IGBT modules.

In some embodiments, the diode arrangement comprises first and second diodes, each having an anode and a cathode, and the capacitance arrangement comprises a capacitance having a first terminal and a second terminal, and wherein the anode of the first diode is connected to the first grid terminal and the cathode of the first diode is connected to the first terminal of the capacitance, and wherein the anode of the second diode is connected to the second grid terminal and the cathode of the second diode is connected to the first terminal of the capacitance;
wherein the second terminal of the capacitance is connected to ground In some embodiments, the switching mechanism comprises a first switch and a second switch connected in series, wherein the first and second switches are arranged to open and close at the same time, optionally wherein the first and second switches respectively comprise IGBT modules.

In some embodiments, the energy transfer branch further comprises a parallel resistance connected in parallel with the capacitance arrangement.

In some embodiments, the energy transfer branch further comprises an arrester connected in parallel with the capacitance arrangement.

In some embodiments, the energy transfer branch further comprises a series resistance connected in series with the capacitance arrangement.

In some embodiments, the energy transfer branch further comprises a series resistance connected in series with the capacitance arrangement, and a parallel resistance connected in parallel with the capacitance arrangement and the series resistance.

In some embodiments, the energy transfer branch further comprises an arrester connected in parallel with the capacitance arrangement and the series resistance.

In some embodiments, the AC switching arrangement is for connection to three phases of an AC grid, the AC switching arrangement comprising for each of the three phases: a said first grid terminal and a said second grid terminal; and a said switching mechanism connected in series between the corresponding first grid terminal and second grid terminal; wherein the energy transfer arrangement is connected in parallel with the first switch of each of the three phases, and wherein the capacitance arrangement comprises a capacitance that is common for all of the three phases; wherein the diode arrangement comprises a first three phase rectifier connected to the first grid terminal of each phase and to the capacitance, and a second three phase rectifier connected to the second grid terminal of each phase and to the capacitance such that both rectifiers charge the capacitance in the same polarity; wherein, on reception of the signal indicating the second state, the switching mechanism is arranged to open the first switch of all the phases.

In some embodiments, the energy transfer arrangement comprises first and second sub-branches for each phase, with the first and second sub-branches being connected either side of their respective switching mechanism; wherein the capacitance comprises a first terminal and a second terminal; wherein the first three phase rectifier has a first node connected to the second terminal of the capacitance, and a second node connected to the first terminal of the capacitance; wherein the second three phase rectifier has a third node connected to the first terminal of the capacitance, and a fourth node connected to the second terminal of the capacitance; wherein the first three phase rectifier comprises, for each of the three phases, a first diode and a second diode that are connected in series, wherein for each phase: the anode of the first diode is connected to the first node, and the cathode of the first diode is connected to the anode of the second diode; the cathode of the second diode is connected to the second node; and the respective first sub-branch connects the first terminal to a node between the cathode of the first diode and the anode of the second diode; wherein the second three phase rectifier comprises, for each of the three phases, a third diode and a fourth diode that are connected in series, wherein for each phase: the anode of the third diode is connected to the fourth node, and the cathode of the third diode is connected to the anode of the fourth diode; the cathode of the fourth diode is connected to the third node; and the respective second sub-branch connects the second terminal to a node between the cathode of the third diode and the anode of the fourth diode.

In some embodiments, the AC switching arrangement is for connection to three phases of an AC grid, the AC switching arrangement comprising for each of the three phases: a said first grid terminal and a said second grid terminal; and a said switching mechanism connected in series between the corresponding first grid terminal and second grid terminal; wherein the energy transfer arrangement comprises an energy transfer sub-branch for each phase, with each energy transfer sub-branch being connected in parallel with its corresponding switching mechanism, and wherein the capacitance arrangement comprises a capacitance that is common for all of the three phases, the capacitance having a first terminal and a second terminal; wherein the diode arrangement comprises first and second diodes on each of the three sub-branches, each having an anode and a cathode; wherein for each phase the anode of the first diode is connected to the first grid terminal and the cathode of the first diode is connected to the first terminal of the capacitance, and wherein the anode of the second diode is connected to the second grid terminal and the cathode of the second diode is connected to the first terminal of the capacitance; wherein the second terminal of the capacitance is connected to ground; wherein, on reception of a signal indicating the second state, the switching mechanism is arranged to open the first switch of all the phases.

In some embodiments, the AC switching arrangement further comprises a parallel resistance connected in parallel with the capacitance arrangement. In some embodiments, the AC switching arrangement further comprises a series resistance connected in series with the capacitance arrangement. In some embodiments, the AC switching arrangement further comprises an arrester connected in parallel with the capacitance arrangement and/or the series resistance.

In some embodiments, the AC switching arrangement further comprises an arrester connected in parallel with the first switch.

In some embodiments, the switching mechanism comprises a snubber in parallel with the first switch. One or more snubbers may be in parallel with all the switches of the switching mechanism.

In embodiments where there is a series resistance (connected in series with the capacitance) but no parallel resistance (i.e. no resistance connected in parallel with the capacitance), an arrester may be connected in parallel with the capacitance but not in parallel with the series resistance.

In some embodiments, the switching mechanism comprises a second switch in series with the first switch; and/or a third switch in parallel with the first switch. In some embodiments, the switching mechanism comprises a plurality of series and parallel connected switches. Snubbers may be placed in parallel with any such switches.

In some embodiments, first switch comprises an electronic switch, and wherein the switching mechanism comprises a parallel mechanical switch connected in parallel with the first switch, and wherein the parallel mechanical switch is closed in the first state and open in the second state; wherein on reception of the signal indicating the second state, the switching mechanism is arranged to open the parallel mechanical switch and then open the first switch after a predetermined delay.

In some embodiments, AC switching arrangement further comprises a series mechanical switch connected in series with the switching mechanism and the energy transfer arrangement, and wherein the series mechanical switch is closed in the first state and open in the second state; wherein on reception of the signal indicating the second state, the AC switching arrangement is arranged to open the first switch and then open the series mechanical switch after a predetermined delay.

In some embodiments, the AC switching arrangement further comprises: a first series mechanical switch connected in series with the switching mechanism and the energy transfer arrangement, wherein the first series mechanical switch is connected between the switching mechanism and the first grid terminal, and wherein the first series mechanical switch is closed in the first state and open in the second state; a second series mechanical switch connected in series with the switching mechanism and the energy transfer arrangement, wherein the second series mechanical switch is connected between the switching mechanism and the second grid terminal, and wherein the second series mechanical switch is closed in the first state and open in the second state; wherein on reception of the signal indicating the second state, the AC switching arrangement is arranged to open the first switch and then open the first and second series mechanical switches after a predetermined delay.

In some embodiments, on reception of the signal indicating the second state, the switching mechanism is arranged to open the first switch and the AC switching arrangement is arranged to interrupt current between the first and second grid terminals.

In some embodiments, the AC switching arrangement further comprises impedance in parallel with the switching mechanism, wherein on reception of the signal indicating the second state, the impedance is arranged to limit current between the first and second grid terminals.

In some embodiments, the switching mechanism and the energy transfer arrangement form a switching unit, and wherein the AC switching arrangement comprises a plurality of said switching unit connected in series and/or parallel.

In some embodiments, the first state represents normal conditions on the grid and the second state represents a fault condition on the grid.

In some embodiments, in the first state, the capacitance is pre-charged to a portion of the voltage of the grid, typically from 5% to 100% of the grid voltage, or higher (e.g. 120%). The capacitance may be pre-charged with the same polarity as it would be charged by the AC grid when the switching mechanism is open.

In some embodiments, the AC switching arrangement comprises a pre-charge circuit for pre-charging the capacitance in the first state.

In some embodiments, the AC switching arrangement further comprises a pre-charge controller arranged to control the switching mechanism to pre-charge the capacitance by opening and re-closing the first switch in a predetermined time, optionally wherein the predetermined time is from 10 to 500 micro seconds. The switching mechanism may open and re-close repeatedly (e.g. once a cycle for a number of cycles) until a desired pre-charge voltage is achieved.

According to an aspect of the invention there is provided a three phase AC switching arrangement for connection to three phases of an AC grid, the AC switching arrangement comprising for each of the three phases: a first grid terminal connectable to a first node in the AC grid and a second grid terminal connectable to a second node in the AC grid; and a switching mechanism connected in series between the first grid terminal and the second grid terminal, wherein the first switching mechanism includes a first switch, and wherein the first switch is closed in a first state and open in a second state; wherein the AC switching arrangement further comprises: an energy transfer arrangement connected in parallel with the first switch of each of the three phases, the energy transfer arrangement comprising a capacitance arrangement and a diode arrangement; wherein the capacitance arrangement comprises a capacitance that is common for all of the three phases; wherein the diode arrangement comprises a first three phase rectifier connected to the first grid terminal of each phase and to the capacitance, and a second three phase rectifier connected to the second grid terminal of each phase and to the capacitance such that both rectifiers charge the capacitance in the same polarity; wherein, on reception of a signal indicating the second state, the switching mechanism is arranged to open the first switch of all the phases; wherein, when the first switches are in the second state, the diode arrangement is arranged in each AC half cycle to enable energy to transfer from the AC grid to the capacitance arrangement but to prevent energy transfer from the capacitance arrangement back to the AC grid.

In some embodiments, the energy transfer arrangement comprises first and second sub-branches for each phase, with the first and second sub-branches being connected either side of their respective switching mechanism; wherein the capacitance comprises a first terminal and a second terminal; wherein the first three phase rectifier has a first node connected to the second terminal of the capacitance, and a second node connected to the first terminal of the capacitance; wherein the second three phase rectifier has a third node connected to the first terminal of the capacitance, and a fourth node connected to the second terminal of the capacitance; wherein the first three phase rectifier comprises, for each of the three phases, a first diode and a second diode that are connected in series, wherein for each phase: the anode of the first diode is connected to the first node, and the cathode of the first diode is connected to the anode of the second diode; the cathode of the second diode is connected to the second node; and the respective first sub-branch connects the first terminal to a node between the cathode of the first diode and the anode of the second diode; wherein the second three phase rectifier comprises, for each of the three phases, a third diode and a fourth diode that are connected in series, wherein for each phase: the anode of the third diode is connected to the fourth node, and the cathode of the third diode is connected to the anode of the fourth diode; the cathode of the fourth diode is connected to the third node; and the respective second sub-branch connects the second terminal to a node between the cathode of the third diode and the anode of the fourth diode.

According to an aspect of the invention there is provided a three phase AC switching arrangement for connection to three phases of an AC grid, the AC switching arrangement comprising for each of the three phases: a first grid terminal connectable to a first node in the AC grid and a second grid terminal connectable to a second node in the AC grid; and a switching mechanism connected in series between the first grid terminal and the second grid terminal, wherein the first switching mechanism includes a first switch, and wherein the first switch is closed in a first state and open in a second state; wherein the AC switching arrangement further comprises: an energy transfer arrangement comprising a capacitance arrangement and a diode arrangement, wherein the energy transfer arrangement comprises an energy transfer sub-branch for each phase, with each energy transfer sub-branch being connected in parallel with its corresponding switching mechanism; wherein the capacitance arrangement comprises a capacitance common for all of the three phases, the capacitance having a first terminal and a second terminal; wherein the diode arrangement comprises first and second diodes on each of the three sub-branches, each having an anode and a cathode; wherein for each phase the anode of the first diode is connected to the first grid terminal and the cathode of the first diode is connected to the first terminal of the capacitance, and wherein the anode of the second diode is connected to the second grid terminal and the cathode of the second diode is connected to the first terminal of the capacitance; wherein the second terminal of the capacitance is connected to ground; wherein, on reception of a signal indicating the second state, the switching mechanism is arranged to open the first switch of all the phases; wherein, when the first switches are in the second state, the diode arrangement is arranged in each AC half cycle to enable energy to transfer from the AC grid to the capacitance arrangement but to prevent energy transfer from the capacitance arrangement back to the AC grid.

In some embodiments, the AC switching arrangement further comprises a parallel resistance connected in parallel with the capacitance arrangement.

In some embodiments, the AC switching arrangement further comprises a series resistance connected in series with the capacitance arrangement.

In some embodiments, the AC switching arrangement further comprises a series resistance connected in series with the capacitance arrangement, and a parallel resistance connected in parallel with the capacitance arrangement and the series resistance.

In some embodiments, the AC switching arrangement further comprises an arrester connected in parallel with the capacitance arrangement and/or the series resistance.

Embodiments of the invention can also provide an AC switching system comprising: an AC switching arrangement according to any of embodiment of the invention; and a control mechanism arranged to detect a fault condition on the AC grid; wherein on detection of the fault condition, the control mechanism is arranged to send a signal indicating a fault condition to the AC switching arrangement.

According to an aspect of the invention there is provided a current limiting interrupter comprising: an AC switching arrangement according to any of the herein described embodiments; and a control mechanism arranged to detect a fault condition on the AC grid; wherein on detection of the fault condition, the control mechanism is arranged to send a signal indicating a fault condition to the AC switching arrangement.

In some embodiments, on detection of the fault condition clearing, the control mechanism is arranged to send a signal indicating a recovery condition to the AC switching arrangement.

In some embodiments, the control mechanism comprises a current sensor arranged to detect a change in grid current.

In some embodiments, the control mechanism comprises a voltage sensor arranged to detect a change in grid voltage.

In some embodiments, the control mechanism is arranged to detect a fault on the basis of a received signal from an external device.

An AC switching arrangement is provided with an energy transfer arrangement connected in parallel with a switching mechanism. The energy transfer arrangement comprises a capacitance arrangement and a diode arrangement. The switching mechanism is normally closed in a first state, and on reception of a signal indicating the second state, the switching mechanism is arranged to open. When the switching mechanism is in the second state, the diode arrangement is arranged in each AC half cycle to enable energy (source energy, stored inductance energy, etc.) to transfer from the grid to the capacitance arrangement but to prevent energy transfer from the capacitance arrangement back to the grid.

Embodiments of the invention will now be described, by way of example and with reference to the accompanying drawings in which:—

Figure 18A:
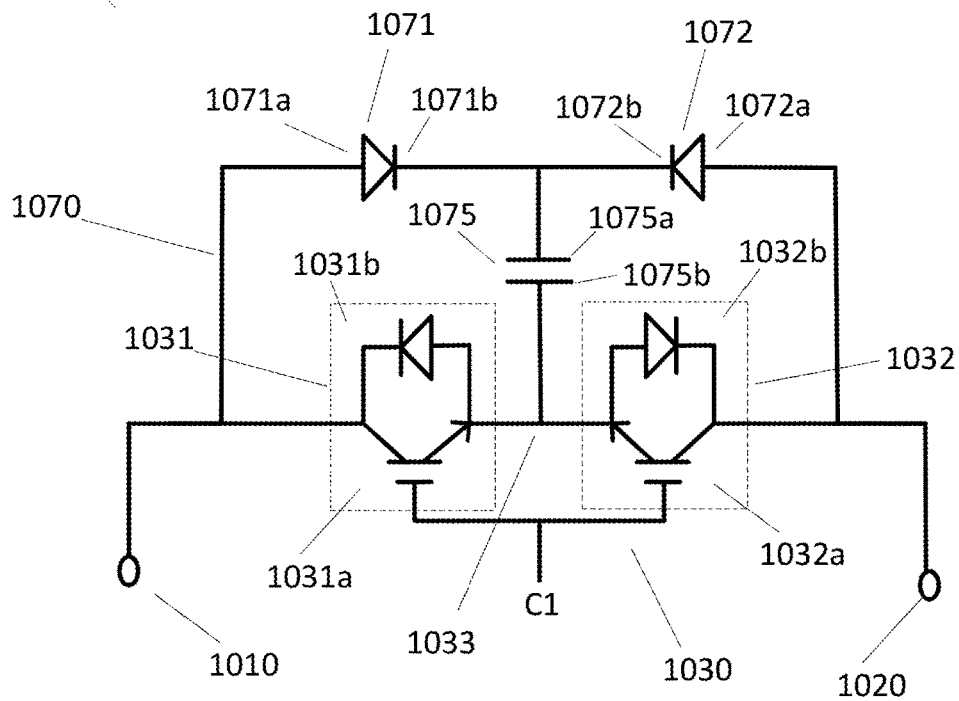
Figure 18B:
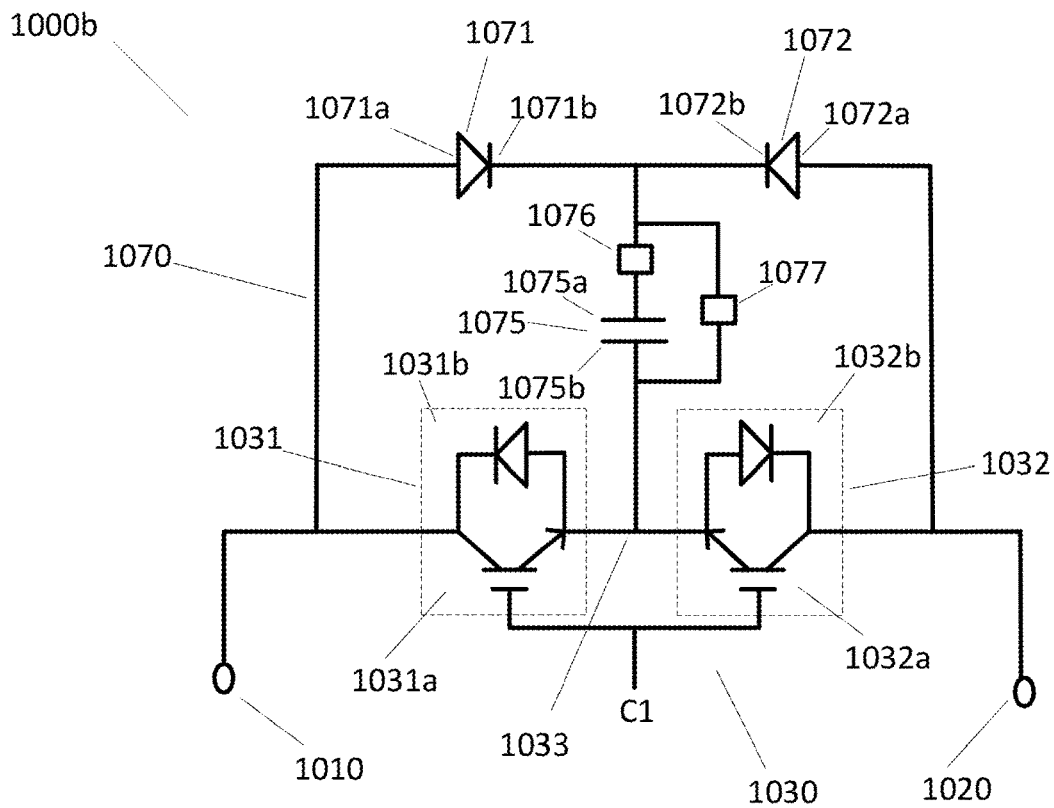
Figure 18C:
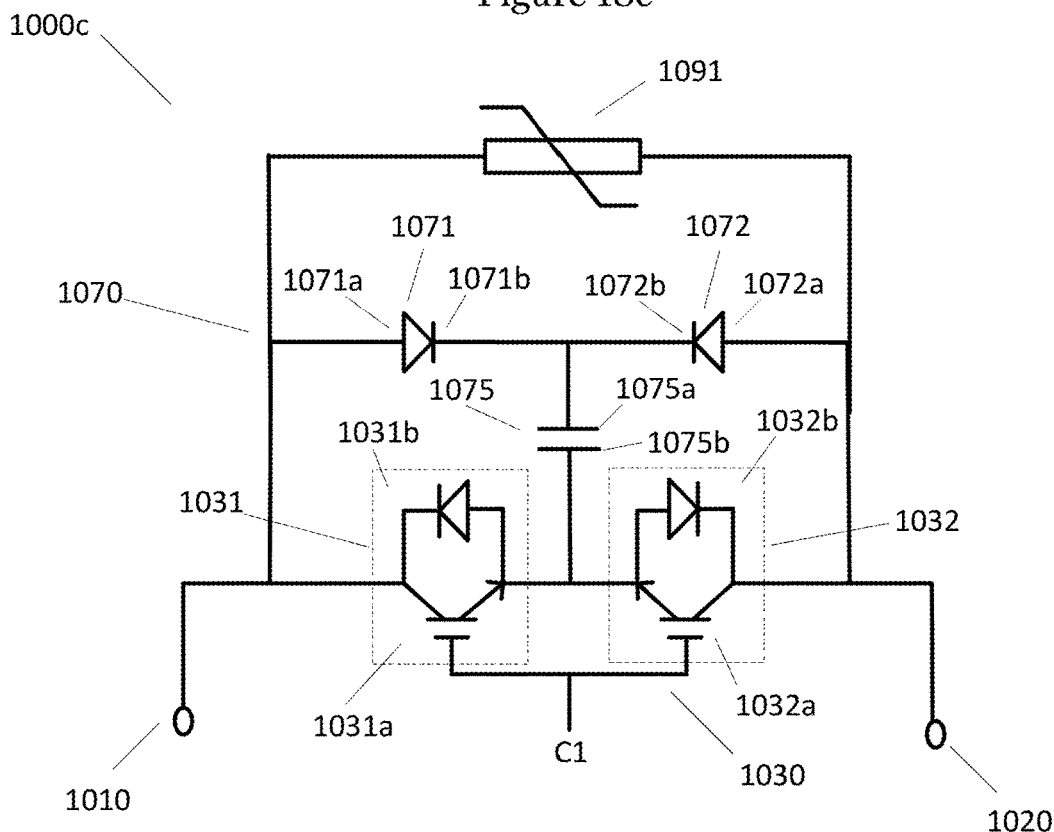
Figure 19:
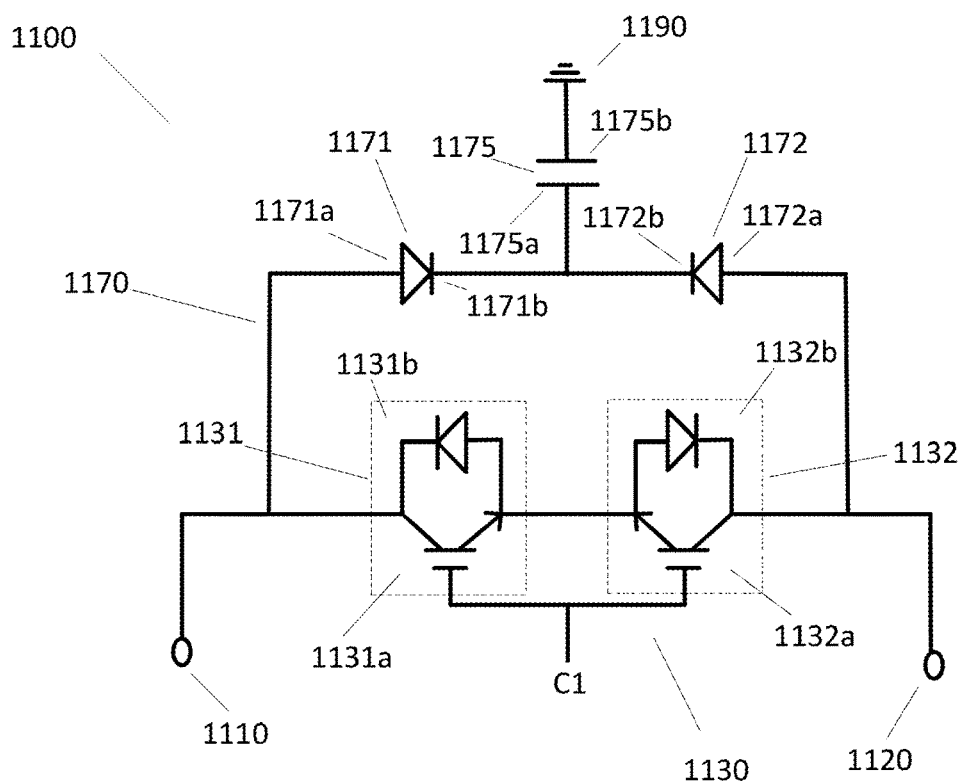
Figure 20:
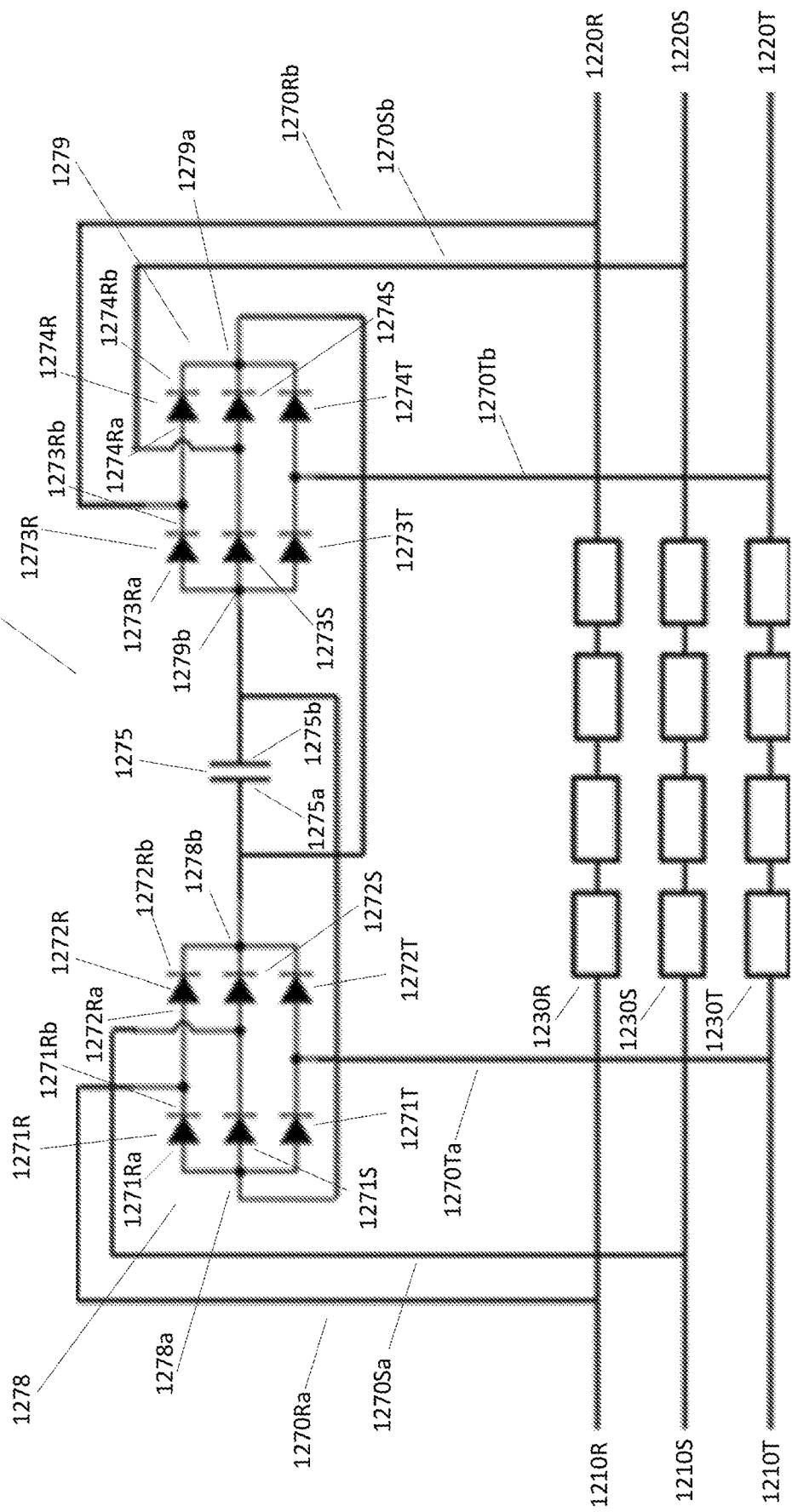
Figure 21:
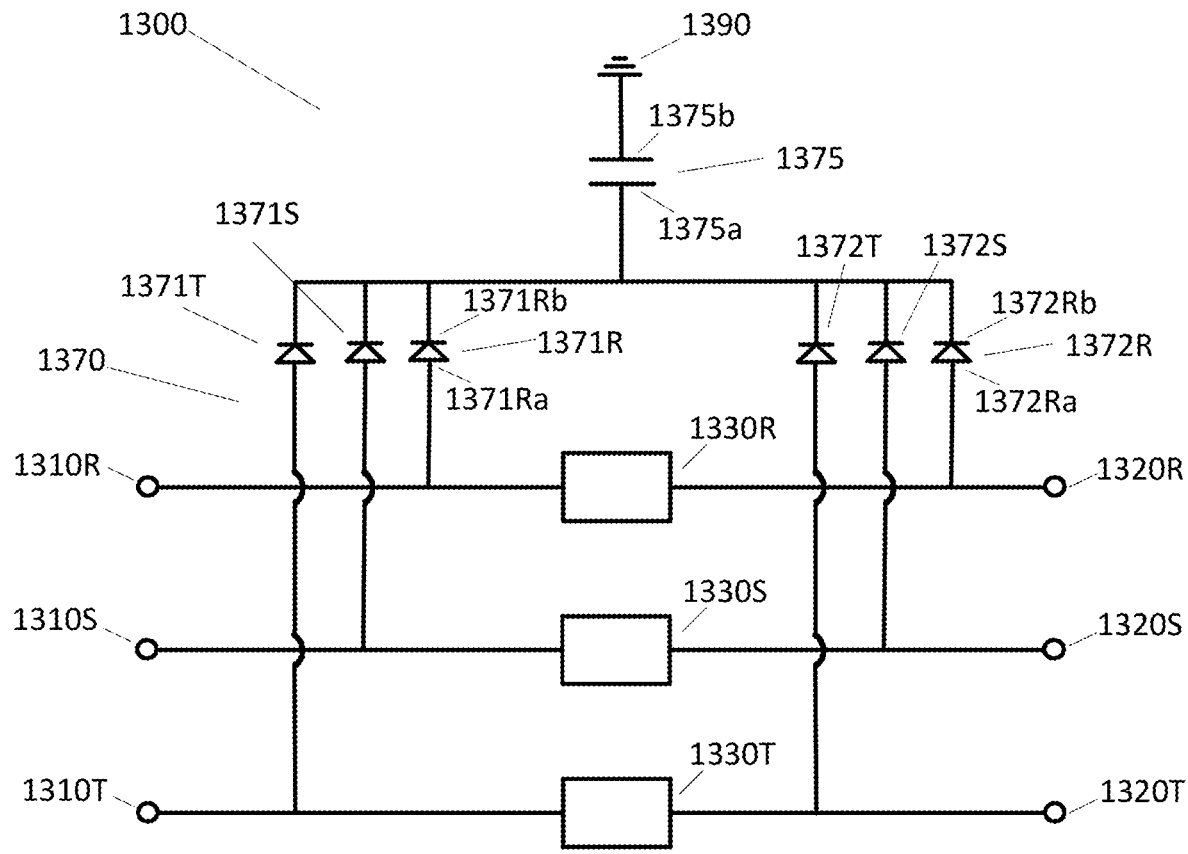
Figure 22:
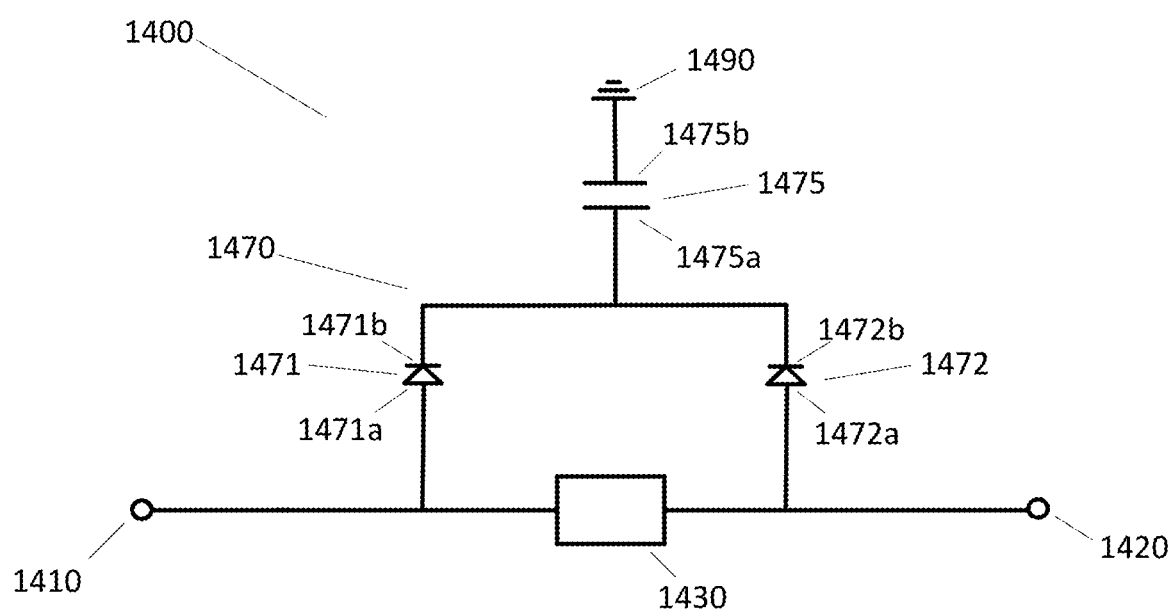
Figure 23:
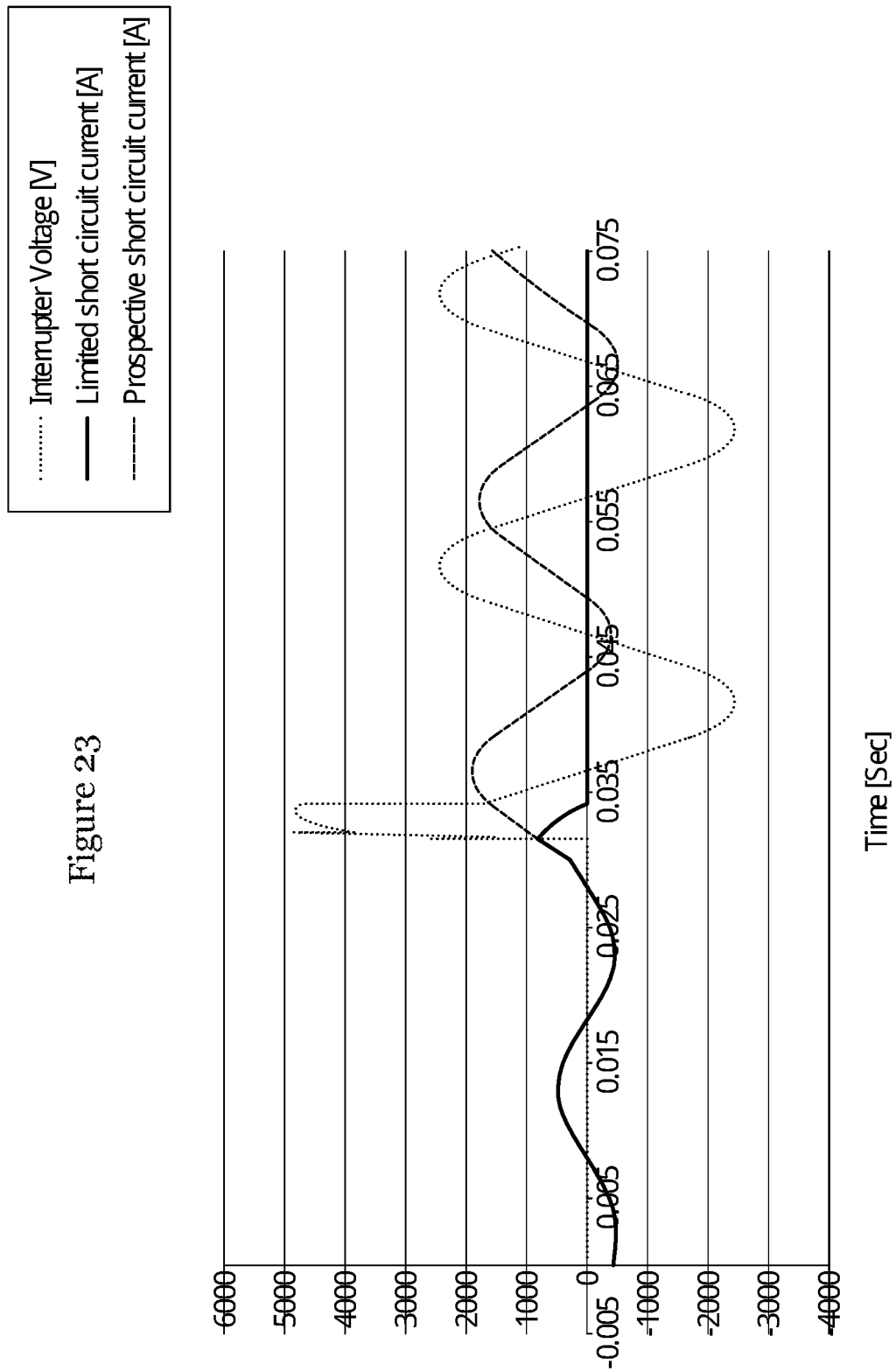
Figure 24:
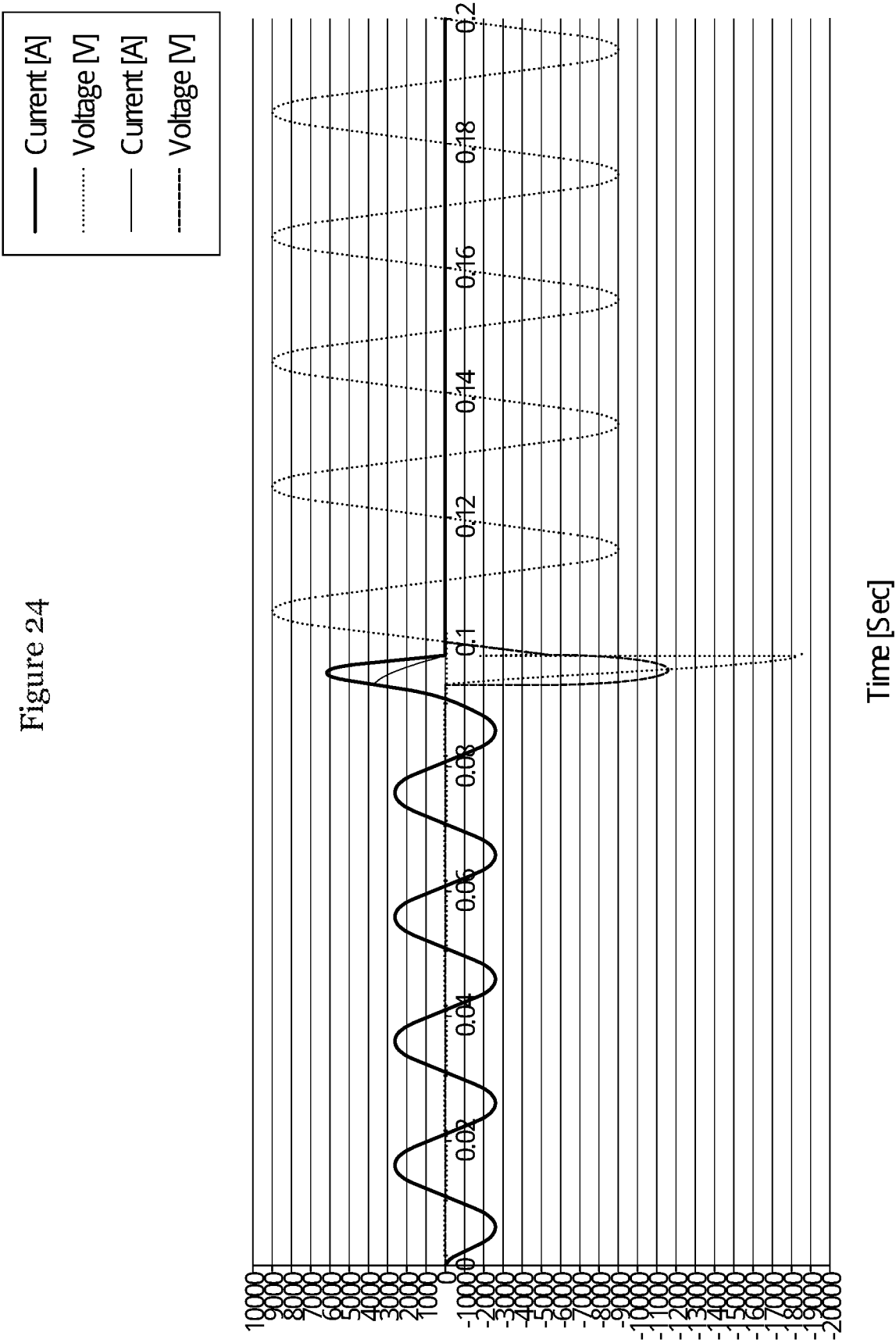
Figure 25:
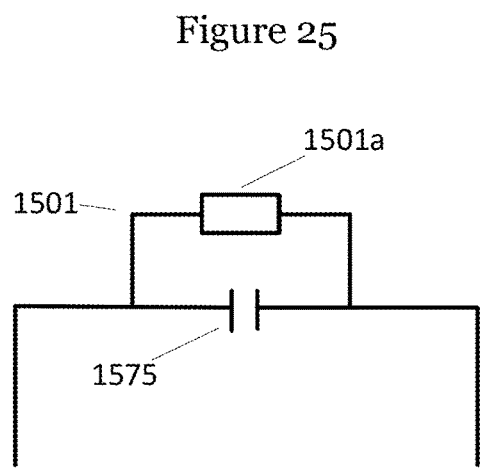
Figure 26:
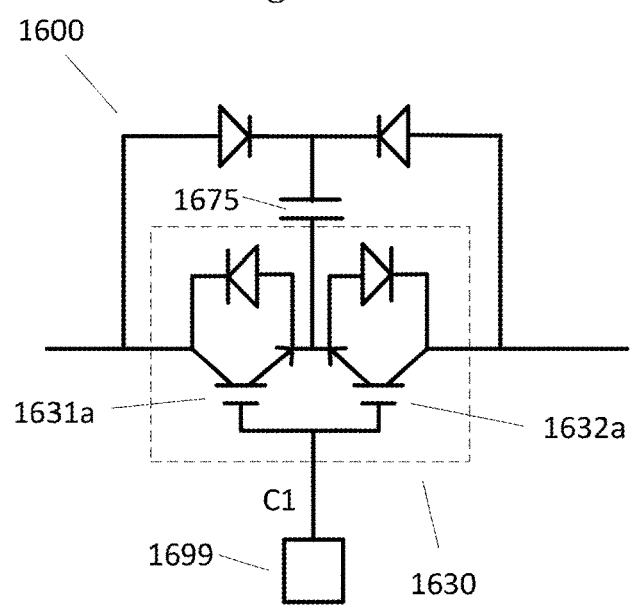
Figure 28:
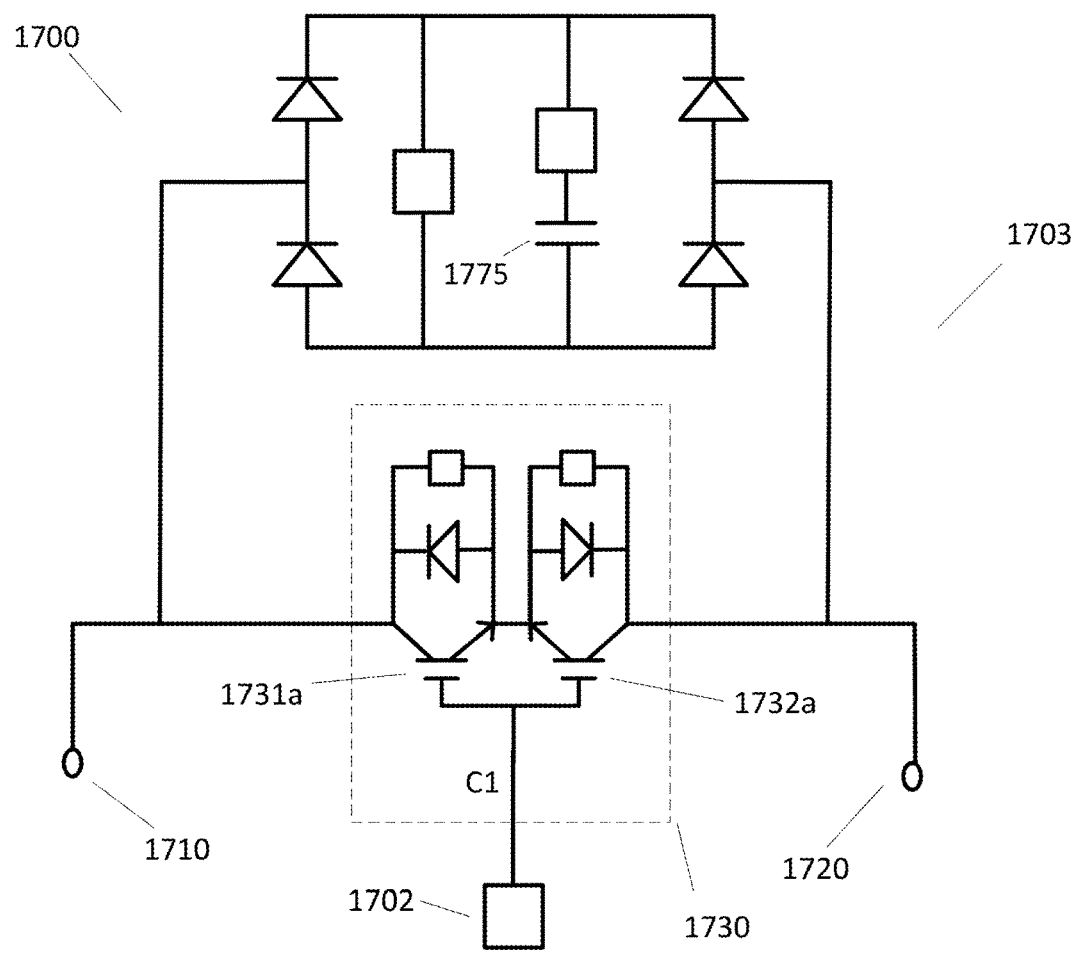
Figure 27:
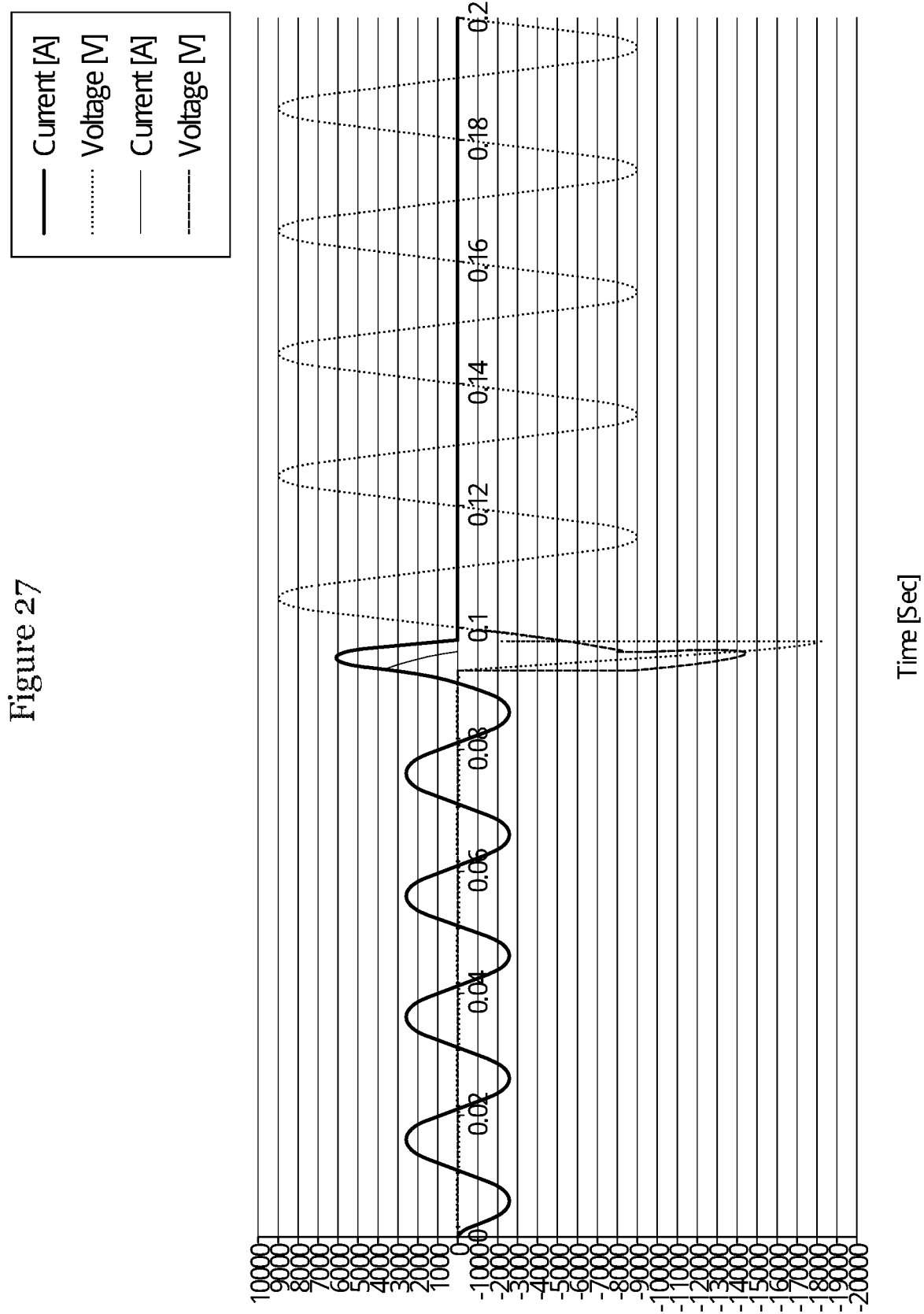

FIG. 18a-c show a schematic illustration of AC switching arrangements according to a tenth embodiment of the invention;

FIG. 19 shows a schematic illustration of an AC switching arrangement according to an eleventh embodiment of the invention;

FIG. 20 shows a schematic illustration of an AC switching arrangement according to a twelfth embodiment of the invention;

FIG. 21 shows a schematic illustration of an AC switching arrangement according to a thirteenth embodiment of the invention;

FIG. 22 shows a schematic illustration of an AC switching arrangement according to a fourteenth embodiment of the invention;

FIG. 23 shows simulation results for an example according to an embodiment of the invention;

FIG. 24 shows simulation results for an example according to an embodiment of the invention;

FIG. 25 shows a schematic illustration of pre-charging circuit for use with an embodiment of the invention;

FIG. 26 shows a schematic illustration of an AC switching arrangement according to an embodiment of the invention;

FIG. 27 shows simulation results for an example according to an embodiment of the invention; and FIG. 28 shows a schematic illustration of a current limiting interrupter according to an embodiment of the invention.

When two or more electrical components are referred to as being "connected", it will be appreciated that this can mean "directly" connected or with one or more intervening components.

Figure 1:
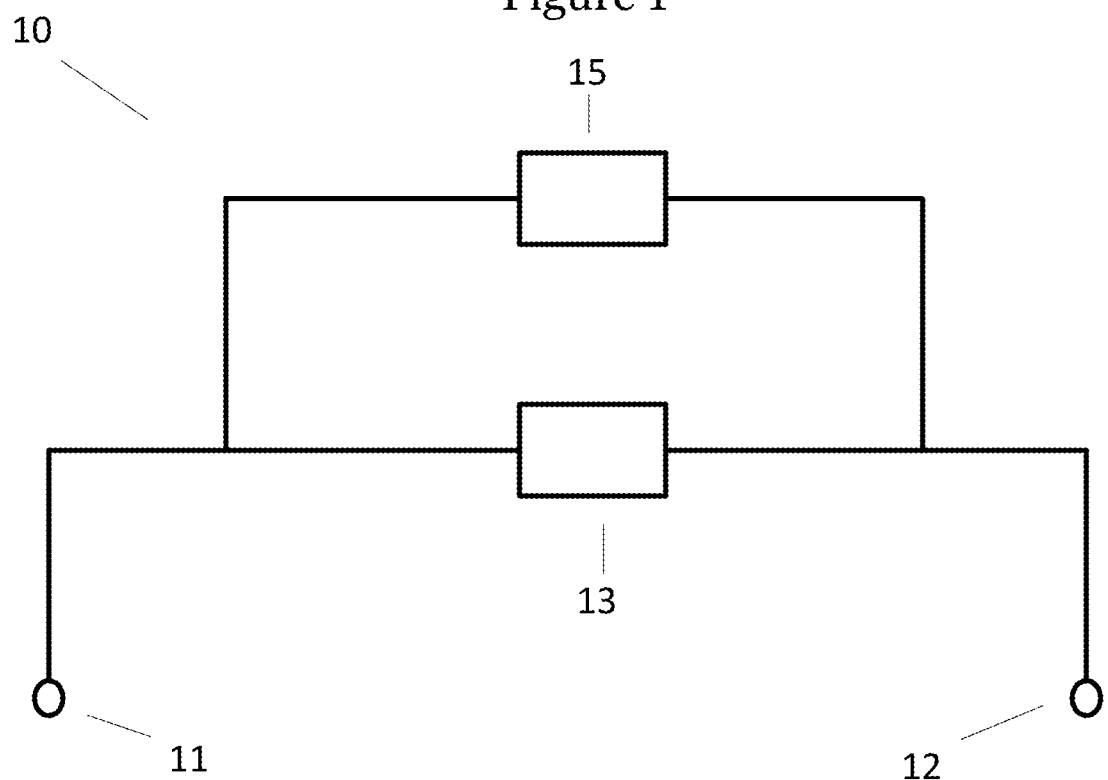
FIG. 1 shows a current interrupter according to a first arrangement.

FIG. 1 shows a first illustrative arrangement of a conventional current interrupter 10 according to a first arrangement.

The current interrupter 10 includes a switching mechanism 13 (e.g. one or more suitable solid state switches) that is closed (switched ON) under normal conditions, and an arrester 15. The current interrupter 10 has a source terminal 11 for connection to an AC grid source (not shown) and a load terminal 12 for connection to a grid load (not shown). Hence, in normal conditions, there is a low voltage drop across the switching mechanism 13. It will be appreciated that the grid has a finite impedance which is closely associated with its short circuit characteristics. Part of this impedance is typically inductive and therefore stores energy which is linearly dependent on the inductance, and square dependent on the momentary current.

If there is a fault condition, the switching mechanism 13 can open to interrupt a current path between the source terminal 11 and the load terminal 12. For example, a current sensor (not shown) may sense the incoming (terminal 11) or outgoing (terminal 12) current, and a controller (not shown) may open the switching mechanism 13 if this current rises over a threshold.

Hence, on reception of a command signal e.g. from a fault detection mechanism (not shown), the switching mechanism 13 is arranged to open (go from ON to OFF state). The arrester 15 is connected across the switching mechanism 13 to absorb and dissipate the energy stored in the grid inductance and supplied by the sources in the grid (i.e. voltage and or current sources such as transformers, generation, etc.) when the switching mechanism 13 is opened.

Hence, in a fault condition the switching mechanism 13 is opened and the energy stored in the grid inductance and supplied by the sources is dissipated by the arrester 15 once the voltage rises to its activation level.

However, such a current interrupter has several shortcomings. One issue is that the selection of the arrester 15 needs to be such that its activation voltage will only cause it to operate during an initial overvoltage during switching. As a result, the switching mechanism 13 needs to be able to withstand the grid voltage when the arrester 15 is not activated. This requirement can make it necessary to use a series connected set of switches that can withstand the voltage across the device during fault conditions, with some margin to assure the arrester does not activate beyond the first current peak of the short circuit condition.

Arresters are variable resistance elements generally used for brief and intermittent surge response. As such their thermal design typically allows for slow natural cooling. In the type of use described herein, arresters will typically heat up significantly when activated, and will need an extended period of time to cool down before they can be used for a subsequent fault action. Furthermore, it will be appreciated that activation voltage accuracy of the arresters may typically be +/−20%, meaning an overrated arrester will be required in practical arrangements. Also, the activation voltage is de-rated with temperature, requiring yet more margins.

It will be appreciated that, in practical arrangements, the normal operation voltage of the arrester 15 (when expected not to conduct) needs to be substantially higher than the grid network voltage. If this is not the case, then during current interruption when the switching mechanism 13 is OFF, the arrester 15 will conduct continuously which will cause it to fail due to overheating. Therefore, the clamping voltage of the arrester 15 needs to be selected significantly higher than the grid network voltage, which means that in practice the switching mechanism 13 needs to use a large number of series electronic switches. Using a large number of series electronic switches adds to the cost of the conventional current interrupter 10 as well as increasing losses. Also, it will be appreciated that higher voltage on the grid is not desired. Also, in practice, conventional current interrupters using arresters need to use parallel connections of arresters which require careful coordination so that they would share current.

Hence, such conventional arrangements using arresters are associated with a number of disadvantages.

Figure 3:
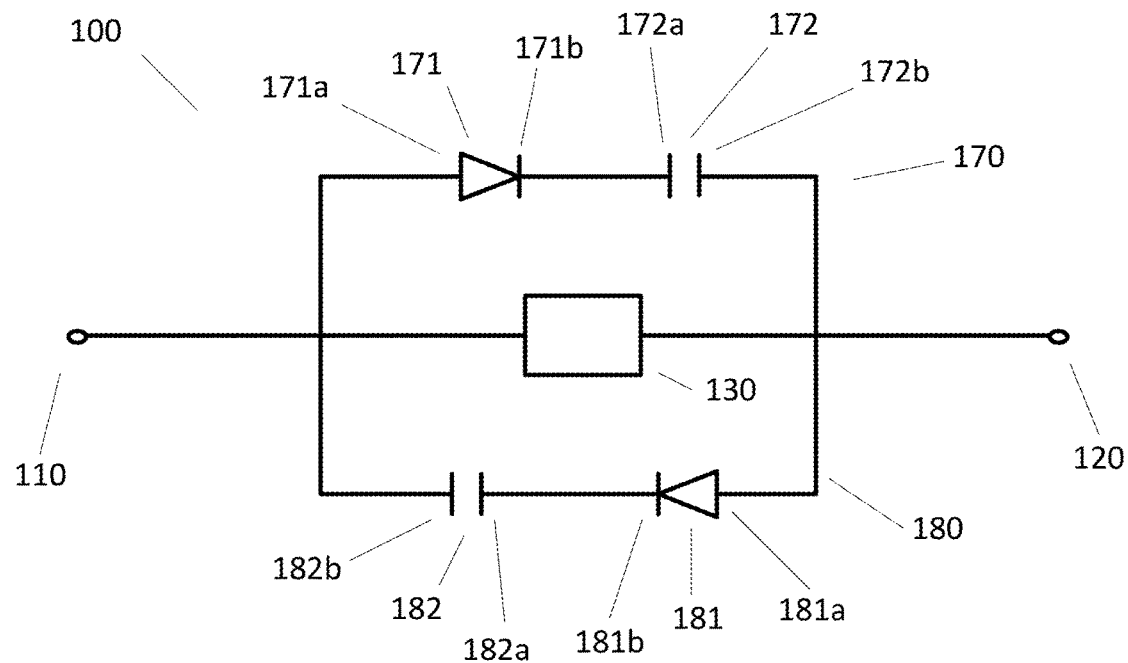
FIG. 3 shows a schematic illustration of an AC switching arrangement according to a first embodiment of the invention.

FIG. 3 shows a schematic illustration of an AC switching arrangement 100 according to a first embodiment of the invention.

The AC switching arrangement wo comprises a source terminal 110, a load terminal 120, a switching mechanism 130, a first energy transfer branch 170, and a second energy transfer branch 180.

The AC switching arrangement 100 in this embodiment is for connection to an AC grid between an AC grid source (not shown) and a grid load (not shown), the AC grid source being arranged to supply power to the grid load. Hence, in this embodiment, the source terminal 110 is connectable to the AC grid source and the load terminal 120 connectable to the grid load. However, it will be appreciated that the AC switching arrangement 100 of this embodiment (and all other embodiments) can be connected in a bus tie arrangement, meaning there can be sources and loads on both terminals of the AC switching arrangement 100. Hence, in general terms, the source terminal 110 can be considered to be a first grid terminal connectable to a first node in the AC grid and the load terminal 120 can be considered to be a second grid terminal connectable to a second node in the AC grid. This can apply for any embodiment of the invention.

In this embodiment, the switching mechanism includes a first switch (not shown) that is closed in normal conditions (an example of a "first state"). Hence, in normal conditions, current flows between the source terminal no and the load terminal 120. In general terms, the "first state" is a state in which the switching mechanism is closed (ON).

When a fault is detected, e.g. by a fault detection mechanism (not shown), a command is issued such that the switching mechanism 130 is controlled to open the first switch. In general terms, a "second state" is a state in which the switching mechanism is open (switching OFF).

For example, the first switch may be implemented as an electronic switch arrangement (e.g. one or more Insulated Gate Bipolar Transistors, IGBTs) that receives a signal indicating a fault condition as a gate signal, causing the transistor to open (switching OFF). It will be appreciated that other embodiments may achieve the appropriate function of the switching mechanism 130 using a different combination of switches (e.g. IGBTs or other switching devices) in series and/or in parallel. Series connection of such switches can enable the withstanding of a higher voltages and higher energy levels during fault conditions, and parallel connection of such switches enable the carrying of higher currents and/or losses to be reduced in normal operation.

The first energy transfer branch 170 is connected in parallel with the first switch, and comprises a first capacitance 172 and a first diode 171. The second energy transfer branch 180 is also connected in parallel with the first switch, and comprises a second capacitance 182 and a second diode 181.

In this embodiment, the first capacitance 172 has a first terminal 172a and a second terminal 172b. The anode 171a of the first diode 171 is connected to the source terminal 110, and the cathode 171b of the first diode 171 is connected to the first terminal 172a of the first capacitance 172. However, it will be appreciated that in other embodiments, the anode 171a of the first diode 171 may be connected to the second terminal 172b of the first capacitance 172 and the cathode 171b of the first diode 171 may be connected to the load terminal 120.

The second capacitance 182 also has a first terminal 182a and a second terminal 182b. The anode 181a of the second diode 181 is connected to the load terminal 120 and the cathode 181b of the second diode 181 is connected to the first terminal 182a of the second capacitance 182. However, it will be appreciated that in other embodiments, the anode 181a of the second diode 181 may be connected to the second terminal 182b of the second capacitance 182 and the cathode 181b of the second diode 181 may be connected to the source terminal 110. Hence, in general terms, the first and second diodes 171, 181 have different polarities in the circuit, but may be connected in various ways in series with the first and second capacitances 172, 182.

When the first switch opens, one of the first capacitance 172 or the second capacitance 182 will begin being charged (depending on the voltage phase angle). Once the first capacitance 172 or the second capacitance 182 is fully charged (the voltage may be higher than the grid voltage) the current will stop flowing during the rest of that half cycle. Then in the next half cycle, the other of the first capacitance 172 or the second capacitance 182 will be charged and once fully charged (again the voltage may be higher than the grid voltage) the current will stop flowing during the rest of that half cycle as well. Hence, the AC switching arrangement 100 of this embodiment can interrupt the current between the source terminal no and the load terminal 120.

It will be appreciated that, in general terms, when a capacitor and an inductor are directly connected, and one of the capacitor or inductor starts out in a charged state, the two components will exchange energy between them, back and forth, creating their own AC voltage and current cycles. Hence, considering the first energy transfer branch, without the presence of the the first diode, energy from the grid inductance would initially flow to the first capacitance. Once fully charged, the first capacitance would discharge and charge the grid inductance, and this cycle would continue akin to a pendulum.

After the fault has cleared (e.g. the faulted grid location has been isolated by a circuit breaker), and a proper signal is provided by e.g. a fault detection mechanism (not shown) or by a control signal from the grid operator, the first switching mechanism 130 is controlled to close the first switch (switch it ON so that it can resume current conduction).

Compared to conventional arrangements, the AC switching arrangement 100 of the first embodiment is associated with a number of advantages, as discussed in more detail later.

The first energy transfer branch 170 and the second energy transfer branch 180 can be consider to together form an energy transfer arrangement that is connected in parallel with the first switch. The energy transfer arrangement can be considered to comprise a capacitance arrangement (i.e. the first capacitance 172 and second capacitance 182 in this embodiment), and a diode arrangement (i.e. the first diode 171 and the second diode 181). When the first switch is opened, the stored magnetic energy of the grid inductance resists an immediate change in the current through the inductance. In the absence of an effective energy transfer branch, the energy stored in the inductance will be manifested as extremely high voltage across the switch, according to Faraday's law of induction. Hence, the diode arrangement (i.e. the first diode 171 and the second diode 181 in this embodiment) is arranged to ensure unidirectional flow of energy from the grid inductance into the energy transfer arrangement, and to prevent energy from flowing back from the energy transfer arrangement into the grid inductance.

Figure 4:
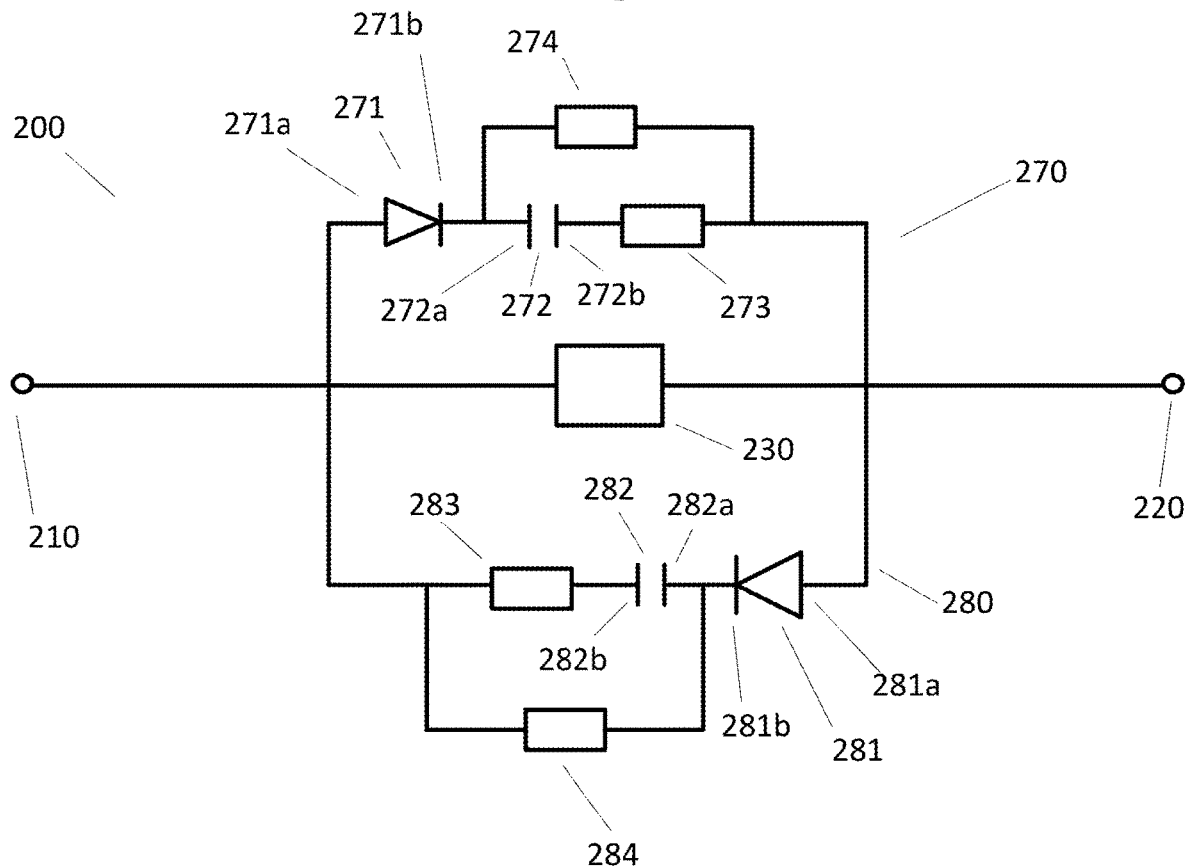
FIG. 4 shows a schematic illustration of an AC switching arrangement according to a second embodiment of the invention.

FIG. 4 shows a schematic illustration of an AC switching arrangement 200 according to a second embodiment of the invention.

The AC switching arrangement 200 comprises a source terminal 210, a load terminal 220, a switching mechanism 230, a first energy transfer branch 270, and a second energy transfer branch 280. As for the first embodiment, the AC switching arrangement 200 is for connection to an AC grid. Hence, in general terms, the source terminal 210 can be considered to be a first grid terminal and the load terminal 220 can be considered to be a second grid terminal The AC switching arrangement 200 of the second embodiment differs in respect to the AC switching arrangement 100 of the first embodiment in terms of the energy transfer arrangement.

The first energy transfer branch 270 is connected in parallel with the switching mechanism 230, and comprises a first capacitance 272 and a first diode 271. The first energy transfer branch 270 further comprises a first parallel resistance 274 connected in parallel with the first capacitance 272, and a first series resistance 273 connected in series with the first capacitance 272. In this embodiment, the first parallel resistance 274 is connected in parallel with the first capacitance 272 and the first series resistance 273 (but not in parallel with the first diode 271), but in other embodiments, the first parallel resistance 274 may be connected in parallel with the first capacitance 272 and not in parallel with the first series resistance 273 (if present).

The second energy transfer branch 280 is also connected in parallel with the switching mechanism 230, and comprises a second capacitance 282 and a second diode 281. The second energy transfer branch 280 further comprises a second parallel resistance 284 connected in parallel with the second capacitance 282, and a second series resistance 283 connected in series with the second capacitance 282. In this embodiment, the second parallel resistance 284 is connected in parallel with the second capacitance 282 and the second series resistance 283 (but not in parallel with the second diode 281), but in other embodiments, the second parallel resistance 284 may be connected in parallel with the second capacitance 282 and not in parallel with the second series resistance 283.

The first and second series resistances 273, 283 and the first and second parallel resistances 274, 284 may be a resistor, varistor or any suitable component.

The general operation of the AC switching arrangement 200 of the second embodiment is similar to the operation of the AC switching arrangement 100 of the first embodiment. In other words, when the switching mechanism 230 is open (i.e. in an OFF state), in each half cycle, energy from the grid can be transferred to the capacitance arrangement (i.e. the first capacitance 272 and second capacitance 282 in this embodiment) but is prevented from returning by the diode arrangement (i.e. the first diode 271 and the second diode 281).

Hence, when the switching mechanism 230 opens, one of the first capacitance 272 or the second capacitance 282 will begin being charged, depending on the voltage phase angle. Once the first capacitance 272 or the second capacitance 282 is fully charged (the voltage may be higher than the grid voltage) the current will stop in that half cycle. Then in the next half cycle, the other of the first capacitance 272 or the second capacitance 282 will be charged and once fully charged (again the voltage may be higher than the grid voltage) the current will stop in that half cycle as well. Hence, the AC switching arrangement 200 can interrupt the current between the source terminal 210 and the load terminal 220.

The first parallel resistance 274 also provides a discharge path for the stored energy in the first capacitance 272. The value of the first parallel resistance 274 determines the time constant of the first capacitance 272. Hence, once the first capacitance 272 is charged, it can begin to discharge via the first parallel resistance 274, with discharge typically taking several cycles (tens or hundreds of milliseconds).

The second parallel resistance 284 is provided to tune the charging characteristics of the second capacitance 282, and to provide a discharge path for the stored energy in the second capacitance 282.

Am important benefit of the parallel resistance is the ability to start dissipating the energy stored in the capacitance immediately as it starts accumulating in the capacitor.

This can expedite the recovery time of the system, to be ready for a subsequent interruption operation while also promptly reducing the system voltage stress.

The first series resistance 273 is provided to dissipate some of the stored grid energy. This can also enable less energy to be transferred to the first capacitance 272. The first series resistance 273 can also help to reduce transient voltages. The second series resistance 283 is provided for the same purpose on the second energy transfer branch 280. The benefit of reducing the transient voltage is in enabling usage of capacitors rated for lower voltage, thus improving size and cost. Likewise, the ability of the series resistance to absorb a substantial amount of the grid energy through dissipation, enables selection of a smaller, cheaper capacitor while reducing the overvoltage stress on the system in that event and shortening the current interruption duration.

Hence, compared to the AC switching arrangement 100 of the first embodiment, the AC switching arrangement 200 of the second embodiment has the first and second parallel resistances 274 and 284 and the first and second series resistances 273 and 283.

In another variant of the first embodiment, an AC switching arrangement may be provided with the first and second parallel resistances 274 and 284 and not the first and second series resistances 273 and 283. In a further variant, an AC switching arrangement may be provided with the first and second series resistances 273 and 283 and not the first and second parallel resistances 274 and 284. In a still further variant, an AC switching arrangement may be provided with different combinations of series and parallel resistances.

Figure 5:
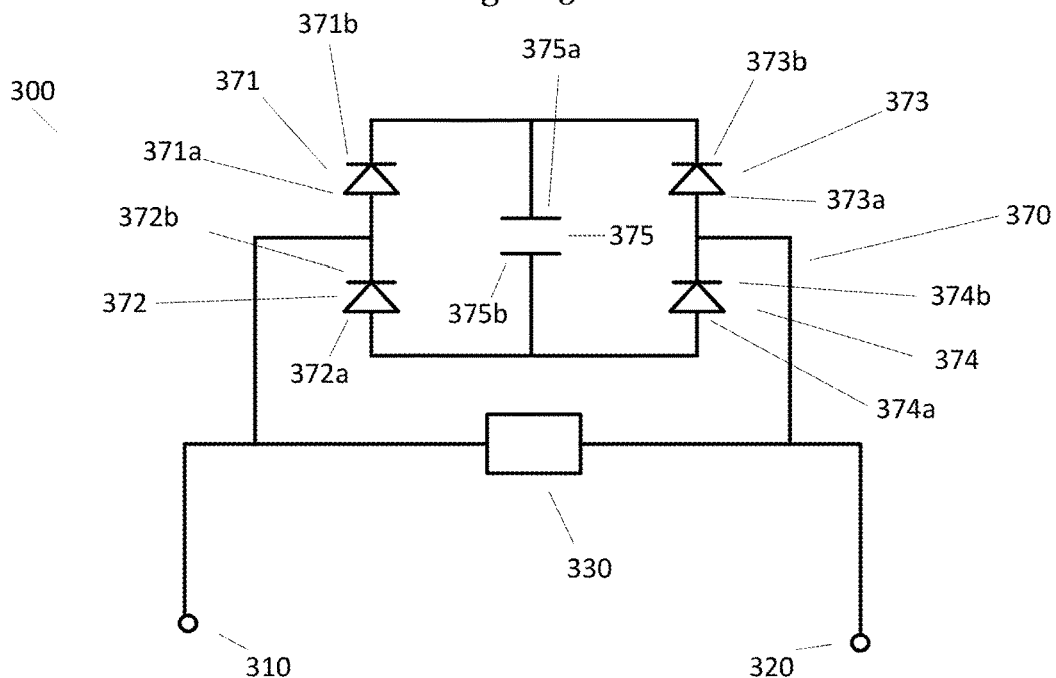
FIG. 5 shows a schematic illustration of an AC switching arrangement according to a third embodiment of the invention.

FIG. 5 shows a schematic illustration of an AC switching arrangement 300 according to a third embodiment of the invention.

The AC switching arrangement 300 comprises a source terminal 310, a load terminal 320, a switching mechanism 330, and an energy transfer branch 370.

The AC switching arrangement 300 is for connection to an AC grid. The source terminal 310 is connectable to the AC grid source and the load terminal 320 connectable to the grid load. However, as with previous embodiments, the source terminal 310 can be considered to be a first grid terminal and the load terminal 320 can be considered to be a second grid terminal.

The switching mechanism 130 is connected in series between the source terminal 310 and the load terminal 320. In this embodiment, the first switching mechanism includes a first switch (not shown) that is closed in normal conditions (first state). Hence, in normal conditions, current flows from the source terminal 310 to the load terminal 320.

The energy transfer branch 370 is connected in parallel with the first switch, and comprises a capacitance arrangement and a diode arrangement.

The capacitance arrangement comprises a capacitance 375 having a first terminal 375a and a second terminal 375b.

The diode arrangement comprises first, second, third and fourth diodes 371, 372, 373, 374, each having an anode and a cathode. The first, second, third and fourth diodes 371, 372, 373, 374 may be arranged in a rectifier configuration.

The anode 371a of the first diode 371 is connected to the source terminal 310 and the cathode 371b of the first diode 371 is connected to the first terminal 375a of the capacitance 375.

The cathode 372b of the second diode 372 is connected to the source terminal 310 and the anode 372a of the second diode 372 is connected to the second terminal 375b of the capacitance 375.

The anode 373a of the third diode 373 is connected to the load terminal 320 and the cathode 373b of the third diode 373 is connected to the first terminal 375a of the capacitance 375.

The cathode 374b of the fourth diode 374 is connected to the load terminal 320 and the anode 374a of the fourth diode 374 is connected to the second terminal 375b of the capacitance 375.

When the switching mechanism 330 is open (i.e. in an OFF state), in each half cycle, energy from the grid can be transferred to the capacitance arrangement (i.e. the capacitance 375 in this embodiment) but is prevented from being returned by the diode arrangement (i.e. the first to fourth diodes).

Hence, when the switching mechanism 330 opens, the capacitance 375 will begin being charged (not depending on the half cycle polarity). Once the capacitance 375 is fully charged (the voltage may be higher than the grid voltage) the current flowing on the energy transfer branch 370 will stop. Hence, when compared to the two branch embodiments mentioned above, this (and other) single branch embodiments can stop the current flow within one half cycle, typically within 1-3 milliseconds.

Hence, the AC switching arrangement 300 can interrupt the current between the source terminal 310 and the load terminal 320.

As mentioned, the first, second, third and fourth diodes 371, 372, 373, 374 can be arranged in a rectifier (i.e. bridge) configuration. However, in other embodiments with a single energy transfer branch, the diode arrangement may be configured differently.

Figure 6:
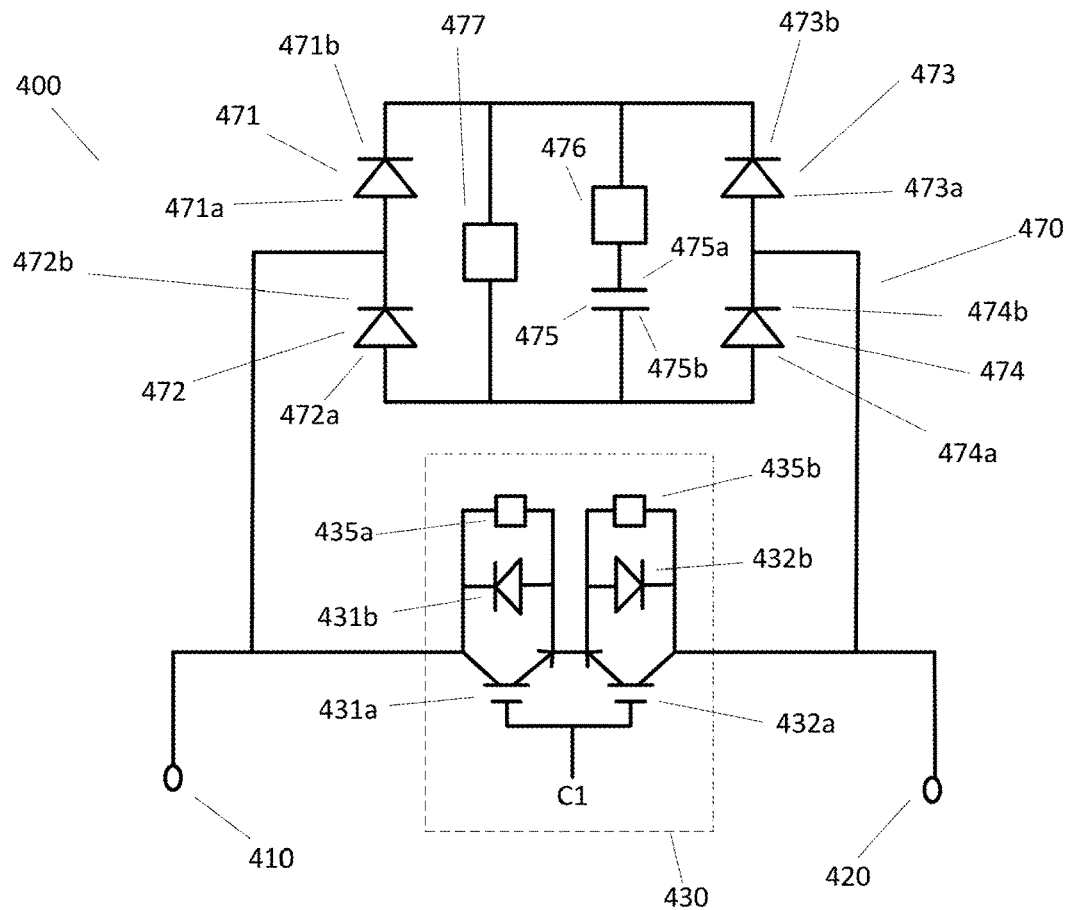
FIG. 6 shows a schematic illustration of an AC switching arrangement according to a fourth embodiment of the invention.

FIG. 6 shows a schematic illustration of an AC switching arrangement 400 according to a fourth embodiment of the invention.

The AC switching arrangement 400 comprises a source terminal 410, a load terminal 420, a switching mechanism 430, and an energy transfer branch 470. The AC switching arrangement 400 is for connection to the AC grid.

The AC switching arrangement 400 of the fourth embodiment differs in respect to the AC switching arrangement 300 of the third embodiment in terms of the energy transfer arrangement.

The energy transfer branch 470 is connected in parallel with the switching mechanism 430, and comprises a capacitance arrangement and a diode arrangement.

The capacitance arrangement comprises a capacitance 475 having a first terminal 475a and a second terminal 475b.

The diode arrangement of this embodiment comprises first, second, third and fourth diodes 471, 472, 473, 474, each having an anode and a cathode. These are arranged in a similar configuration to the diodes of the third embodiment. Hence, the anode 471a of the first diode 471 is connected to the source terminal 410 and the cathode 471b of the first diode 471 is connected to the first terminal 475a of the capacitance 475. The cathode 472b of the second diode 472 is connected to the source terminal 410 and the anode 472a of the second diode 472 is connected to the second terminal 475b of the capacitance 475. The anode 473a of the third diode 473 is connected to the load terminal 420 and the cathode 473b of the third diode 473 is connected to the first terminal 475a of the capacitance 475. The cathode 474b of the fourth diode 474 is connected to the load terminal 420 and the anode 474a of the fourth diode 474 is connected to the second terminal 475b of the capacitance 475.

The energy transfer branch 470 further comprises a parallel resistance 477 connected in parallel with the capacitance 475, and a series resistance 476 connected in series with the capacitance 475.

The parallel resistance 477 provides a discharge path for the stored energy in the capacitance 475. Furthermore, the value of the parallel resistance 477 determines the time constant of the capacitance 475. An important benefit of the parallel resistance is the ability to start dissipating the energy stored in the capacitance immediately as it starts accumulating in the capacitor. This can expedite the recovery time of the system, to be ready for a subsequent interruption operation while also promptly reducing the system voltage stress.

In this embodiment, the parallel resistance 477 is connected in parallel with the capacitance 475 and the series resistance 476, but in other embodiments, a parallel resistance may be connected in parallel with the capacitance 475 and not in parallel with the series resistance 476.

The series resistance 476 is provided to dissipate some of the stored grid energy. This can also enable less energy to be transferred to the capacitance 475. The series resistance 476 can also help to reduce transient voltages. The benefit of reducing the transient voltage is in enabling usage of capacitors rated for lower voltage, thus improving size and cost. Likewise, the ability of the series resistance to absorb a substantial amount of the grid energy through dissipation enables selection of a smaller, cheaper capacitor while reducing the overvoltage stress on the system in that event and shortening the current interruption duration.

Hence, compared to the AC switching arrangement 300 of the third embodiment, the AC switching arrangement 400 of the fourth embodiment has the parallel resistance 477 and the series resistance 476. In another variant of the third embodiment, an AC switching arrangement may be provided with the parallel resistance 477 and not the series resistance 476. In a further variant, an AC switching arrangement may be provided with the series resistance 476 and not the parallel resistance 477. In a still further variant, an AC switching arrangement may be provided with different combinations of series and parallel resistances.

Furthermore, in this embodiment, the switching mechanism 430 comprises two back to back IGBTs 431a, 432a. Each IGBT 431a, 432a has a respective parallel connected diode 431b, 432b, with the diode 431b, 432b connected with opposite polarities. It will be appreciated that the switching mechanisms of any of the embodiments of the invention could comprise such a configuration of IGBTs and diodes. The IGBTs 431a, 432a in this embodiment receive a control signal C1 to open/close the IGBTs 431a, 432a. The control signal C1 may come from a suitable controller (not shown) that may be either external or internal to the AC switching arrangement 400. In other embodiments, the switching mechanism 430 may comprise a different number of series or parallel connected IGBTs. In yet other embodiments the switching mechanism 430 may comprise different semiconductor switching devices such as thyristors, GTOs or IGCTs (or any other suitable component).

In this embodiment the switching mechanism 430 also comprises two snubber arrangements 435a, 435b, each in parallel with one of the IGBTs 431a, 432a. The snubber arrangements 435a, 435b each comprise a capacitance and a resistance in this embodiment (not shown). It will be appreciated that such a snubber arrangement could be implemented in a number of ways, e.g. using RC snubbers or varistor snubbers. A person skilled in the art would appreciate that other snubber topologies can be adopted. Furthermore, it will be appreciated that suitable snubbers can be added in parallel to any of the switches in the switching mechanism of any embodiment of the invention.

Figure 7:
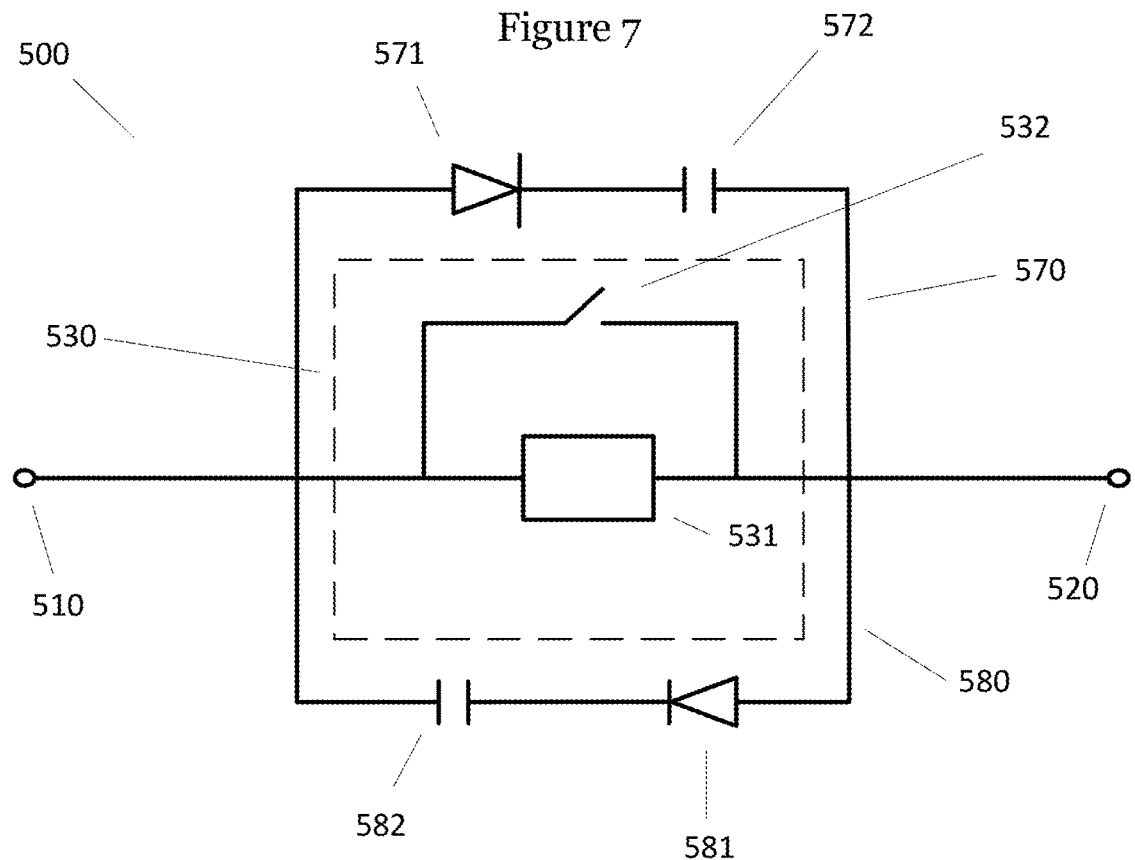
FIG. 7 shows a schematic illustration of an AC switching arrangement according to a fifth embodiment of the invention.

FIG. 7 shows a schematic illustration of an AC switching arrangement 500 according to a fifth embodiment of the invention.

The AC switching arrangement 500 comprises a source terminal 510, a load terminal 520, a switching mechanism 530, a first energy transfer branch 570, and a second energy transfer branch 580.

The AC switching arrangement 500 is a variant of the AC switching arrangement 100 of the first embodiment. The AC switching arrangement 500 differs from the AC switching arrangement 100 of the first embodiment in relation to the switching mechanism 530.

The switching mechanism 530 is connected in series between the source terminal 510 and the load terminal 520. In this embodiment, the first switching mechanism includes a first switch 531 and a second switch 532. Both the first switch 531 and the second switch 532 are closed in normal conditions (first state). Hence, in normal conditions, current flows from the source terminal 510 to the load terminal 520.

In this embodiment, the first switch 531 is an electronic switch (e.g. one or more IGBTs in series and/or in parallel). The second switch 532 is a mechanical switch that is connected in parallel with the electronic first switch 531.

In normal operation, the mechanical second switch 532 is conducting the network current, bypassing the electronic first switch 531 since its ON state resistance is much lower than the first electronic switch. Upon fault detection, the mechanical second switch 532 is rapidly switched OFF (e.g. within 1 milliseconds), diverting the current to the electronic first switch 531. After a short delay (e.g. 50 micro-seconds) the electronic first switch 531 interrupts the current.

An advantage of the mechanical switch carrying the normal current is that the operating power losses are greatly reduced due to the negligible voltage drop on the electronic switch. This enables designing the electronic switch with reduced number of switching devices (e.g. IGBTs), as the electronic switch(es) will only carry current very briefly during interruption operation. Commutation of the current from a mechanical switch to an electronic switch before interrupting the current using the electronic switch prevents the developing of a high voltage arc inside the mechanical switch.

Furthermore, although the use of a mechanical switch in parallel with an electronic switch as the switching arrangement is described above in relation to FIG. 7 (i.e. as a variant of the first embodiment), it will be appreciated that a mechanical switch in parallel with an electronic switch could be used as the switching arrangement for any embodiment of the invention.

Hence, in general terms, the first switch may comprise at least one electronic switch, and the switching mechanism may further comprise a parallel mechanical switch connected in parallel with the at least one electronic switch that is closed in the first state and open in the second state. On reception of a signal indicating the second state, the switching mechanism may be arranged to open the parallel mechanical switch and then open the first switch after a predetermined delay.

Furthermore, any of the discussed embodiments of the invention may be modified to comprise a series mechanical switch connected in series with an electronic first switch and the energy transfer arrangement. Such a series mechanical switch is closed in the first state and open in the second state. On reception of the signal indicating the second state, the switching mechanism may be arranged to open the first switch and then open the series mechanical switch after a predetermined delay. Hence, such embodiments enable an isolation arrangement to be provided for rapid galvanic isolation of the electronic switch from the network after it has acted to disconnect the fault current.

Furthermore, any of the discussed embodiments of the invention may be modified so that the AC switching arrangement comprises two series mechanical switches, connected either side of the switching mechanism (e.g. comprising an electronic switch) and the energy transfer arrangement. These series mechanical switches can be ON during normal operation, and are switched OFF very shortly after the first switch (e.g. an electronic switch) has interrupted the current through it. This operation enables galvanic isolation of the first switch (e.g. an electronic switch) from the network voltage, and is also useful for maintenance.

As mentioned, the first switch of the switching mechanism of any of the embodiments of the invention may use one or more electronic switches (e.g. using a different combination of switches, e.g. IGBTs or other switching devices, in series and/or in parallel). For example, in any of the embodiments, the switching mechanism can comprise series and/or parallel electronic switches. In such case, series connection enables withstanding higher system voltages and higher energy levels during fault, and parallel connections enable reducing losses in normal operation. Hence, the appropriate combination of series and/or parallel electronic switches can be chosen depending on the application.

Figure 8:
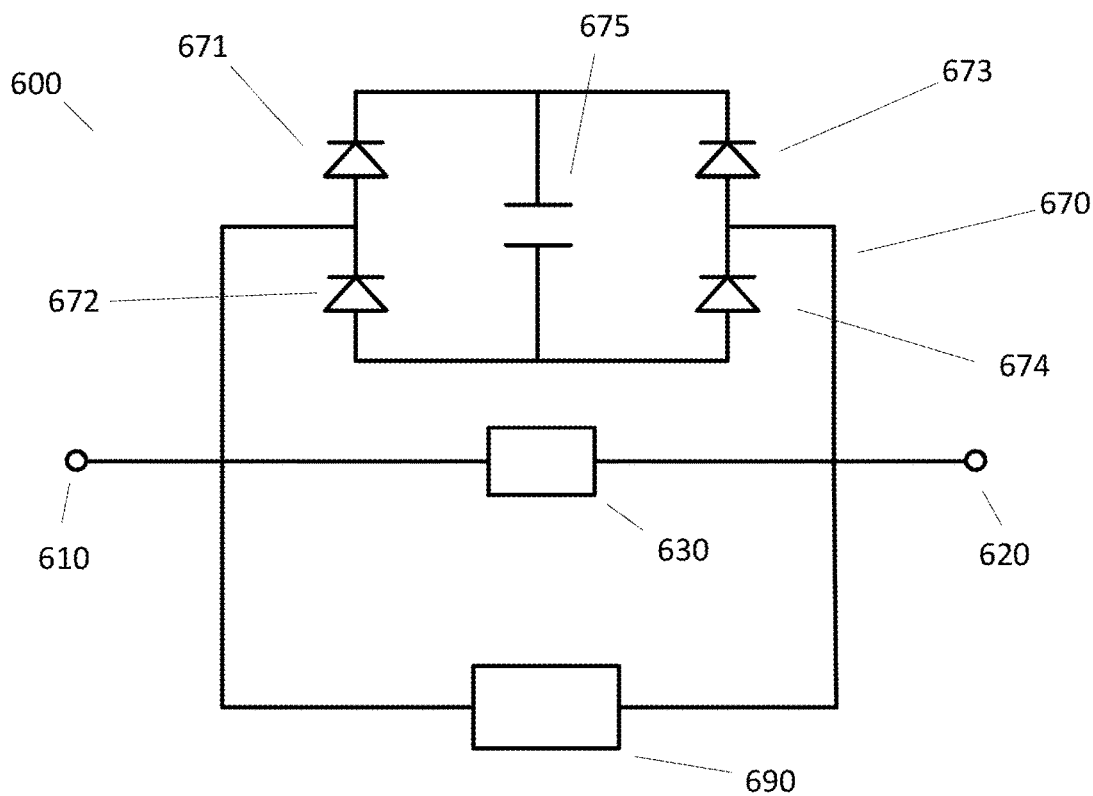
FIG. 8 shows a schematic illustration of an AC switching arrangement according to a sixth embodiment of the invention.

FIG. 8 shows a schematic illustration of an AC switching arrangement 600 according to a sixth embodiment of the invention.

The AC switching arrangement 600 comprises a source terminal 610, a load terminal 620, a switching mechanism 630, and an energy transfer branch 670.

The AC switching arrangement 600 is a variant of the AC switching arrangement 300 of the third embodiment. The AC switching arrangement 600 differs from the AC switching arrangement 300 of the third embodiment in that it further comprises an impedance 690 in parallel with the energy transfer branch 670.

As a result of the impedance 690, the AC switching arrangement 600 can act as a current limiter as opposed to an interrupter. Hence, when the switching mechanism 630 opens, the capacitance 675 will begin to be charged. Once the capacitance 675 is fully charged (the voltage may be higher than the grid voltage) the current flowing on the energy transfer branch 670 will stop.

In normal conditions (i.e. switching mechanism 630 in a closed state), the impedance 690 is bypassed. However, once the switching mechanism 630 opens, and while the capacitance 675 is charging, the current flowing on the energy transfer branch 670 will start commutating to the impedance 690. When the capacitance 675 is fully charged the current flowing on the energy transfer branch 670 will stop, thus completing the commutation process to impedance 690. Hence, current will flow via the impedance 690, which will act to limit the current.

The impedance 690 could take any suitable form, such as a current limiting air core reactor.

Furthermore, although the parallel impedance is described above in relation to FIG. 8 (i.e. as a variant of the third embodiment), it will be appreciated that a parallel impedance could be added to an AC switching arrangement according to any embodiment of the invention.

Hence, in general terms, the AC switching arrangement of any embodiment of the invention may comprise an impedance in parallel with the energy transfer arrangement so as to act as a current limiter. On reception of the signal indicating the second state, the impedance is arranged to limit current between the source and load terminals.

Furthermore, embodiments of the invention may be provided with one or more arresters. For example, as a modification of an AC switching arrangement of any of the herein described embodiments with a first energy transfer branch and a second energy transfer branch, one or more arresters may be provided in parallel with the first and second capacitances. Furthermore, as a modification of an AC switching arrangement of any of the herein described embodiments with a single energy transfer branch, an arrester may be provided in parallel with the capacitance.

For AC switching arrangements of any of the herein described embodiments with one or two energy transfer branches, the one or more arrester may be provide in various locations and embodiments of the invention are not limited in this way.

Figure 9:
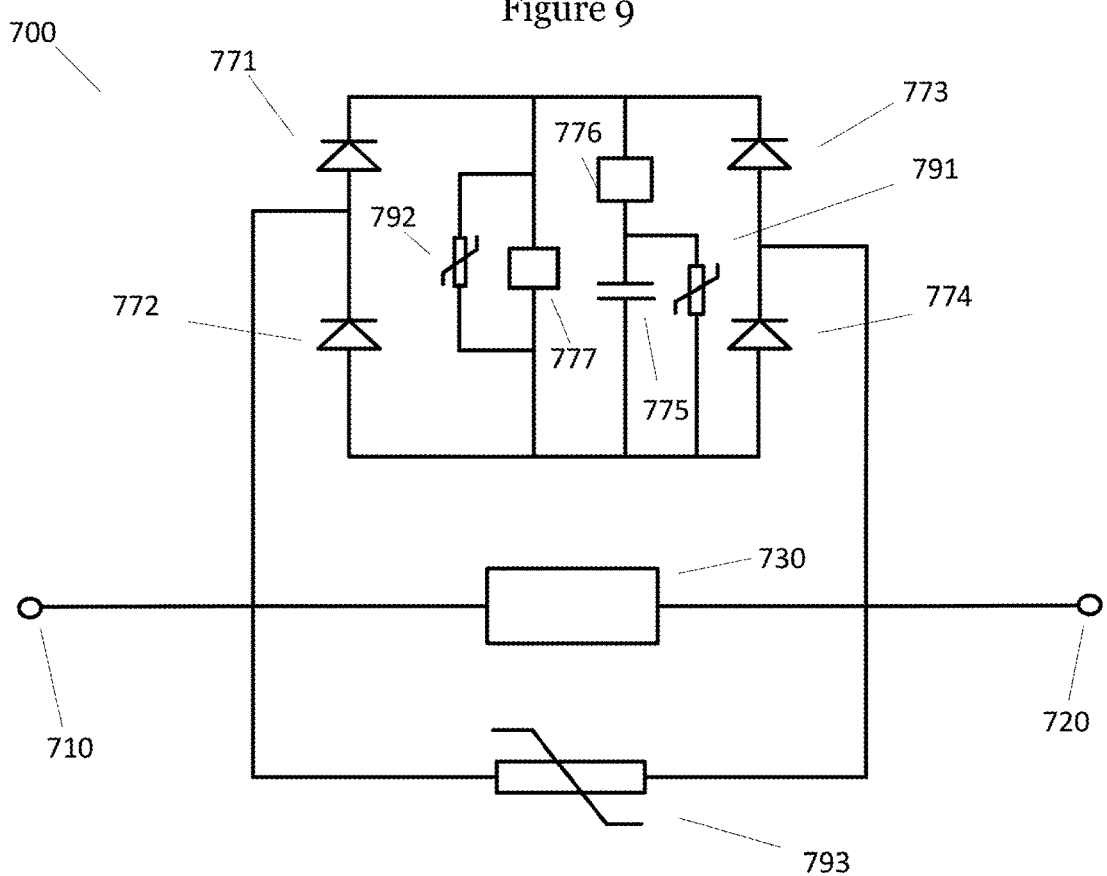
FIG. 9 shows a schematic illustration of an AC switching arrangement according to a seventh embodiment of the invention.

FIG. 9 shows a schematic illustration of an AC switching arrangement 700 according to a seventh embodiment of the invention.

The AC switching arrangement 700 comprises a source terminal 710, a load terminal 720, a switching mechanism 730, and an energy transfer branch 770.

The energy transfer branch 770 is connected in parallel with the switching mechanism 730, and comprises a capacitance arrangement and a diode arrangement. The capacitance arrangement comprises a capacitance 775 and the diode arrangement comprises first, second, third and fourth diodes 771, 772, 773, 774. The energy transfer branch 770 further comprises a parallel resistance 777 connected in parallel with the capacitance 775, and a series resistance 776 connected in series with the capacitance 775.

The AC switching arrangement 700 of the seventh embodiment differs in general terms in respect to the AC switching arrangement 400 of the fourth embodiment in that it comprises three arresters: a first arrester 791, a second arrester 792 and a third arrester 793.

The first arrester 791 and the second arrester 792 are provided in the energy transfer branch 770.

The first arrester 791 is connected in parallel with the capacitance 775. The second arrester 792 is connected in parallel with the parallel resistance 777. The third arrester 793 is connected in parallel with the switching mechanism 730.

The first arrester 791, second arrester 792 and third arrester 793 enables the AC switching arrangement 700 to use a lower voltage on the capacitance 775 (compared to an embodiment without the arresters) as a result of dissipating energy that would otherwise be transferred to the capacitance 775. This allows for selecting a lower-rated-voltage capacitor, and/or a smaller capacitor.

Other embodiments can use any one of or combination of the first arrester 791, second arrester 792 and third arrester 793.

Furthermore, it will be appreciated that arresters can be placed in various parts of the circuit of the AC switching arrangement 700 for this purpose. For example, in embodiments where there is a series resistance (connected in series with the capacitance) but no parallel resistance (i.e. no resistance connected in parallel with the capacitance), an arrester may be connected in parallel with the capacitance but not in parallel with the series resistance.

Hence, such embodiments can include one or more arresters connected in parallel with the switching mechanism and/or the capacitance.

Figure 10:
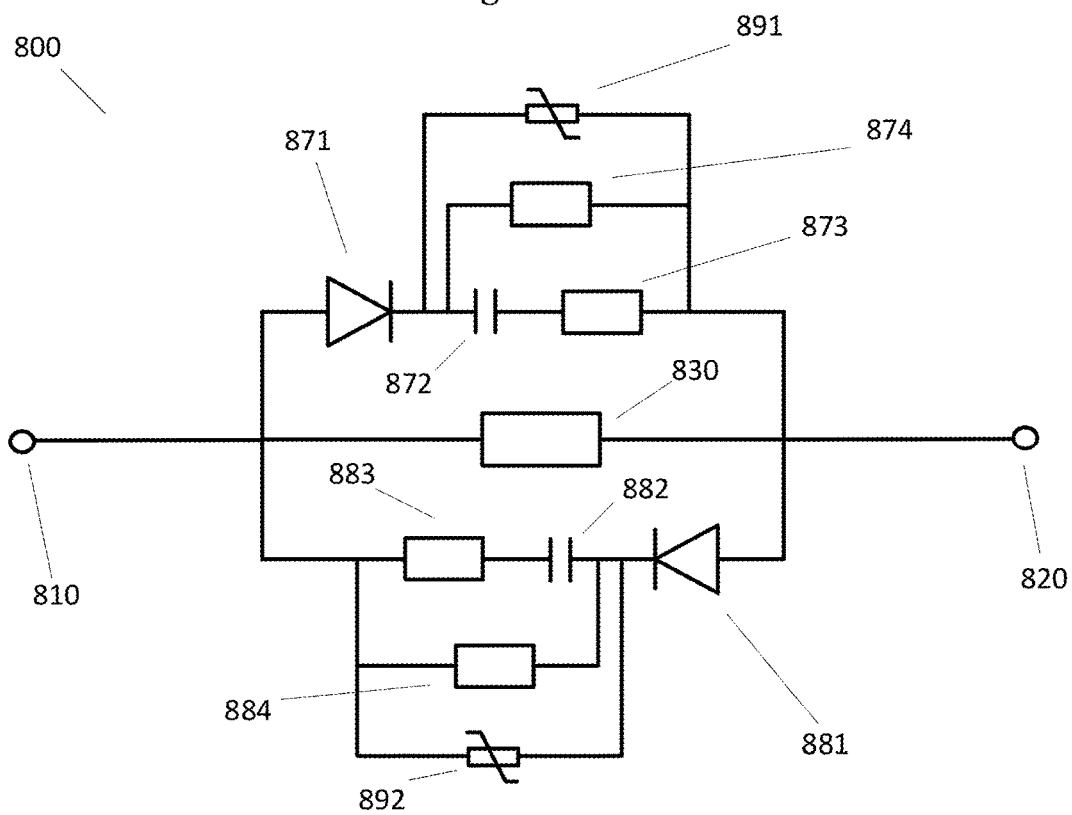
FIG. 10 shows a schematic illustration of an AC switching arrangement according to an eighth embodiment of the invention.

FIG. 10 shows a schematic illustration of an AC switching arrangement 800 according to an eighth embodiment of the invention.

The AC switching arrangement 800 comprises a source terminal 810, a load terminal 820, a switching mechanism 830, a first energy transfer branch 870, and a second energy transfer branch 880.

The first energy transfer branch 870 is connected in parallel with the switching mechanism 830, and comprises a first capacitance 872 and a first diode 871. The first energy transfer branch 870 further comprises a first parallel resistance 874 connected in parallel with the first capacitance 872, and a first series resistance 873 connected in series with the first capacitance 872.

The second energy transfer branch 880 is also connected in parallel with the switching mechanism 830, and comprises a second capacitance 882 and a second diode 881. The second energy transfer branch 880 further comprises a second parallel resistance 884 connected in parallel with the second capacitance 882, and a second series resistance 283 connected in series with the second capacitance 882.

The AC switching arrangement 800 of the eighth embodiment differs in general terms in respect to the AC switching arrangement 200 of the second embodiment in that it comprises two arresters: a first arrester 891, a second arrester 892.

The first arrester 891 is provided in the first energy transfer branch 870 and is connected in parallel with the first series resistance 873 and the first capacitance 872.

The second arrester 892 is provided in the second energy transfer branch 880 and is connected in parallel with the second series resistance 883 and the second capacitance 882.

Other embodiments, can use either of the first arrester 891 and the second arrester 892 without the other.

The use of such arresters allows for selecting a lower-rated-voltage capacitor, and/or a smaller capacitor. Furthermore, it will be appreciated that arresters can be placed in various parts of the circuit of the AC switching arrangement 800 for this purpose. For example, in some embodiments, an arrester may be connected in parallel with the capacitance of each energy transfer branch but not in parallel with the series resistance (if present).

Hence, such embodiments can include one or more arresters connected in parallel with the switching mechanism and/or the capacitance.

Figure 11:
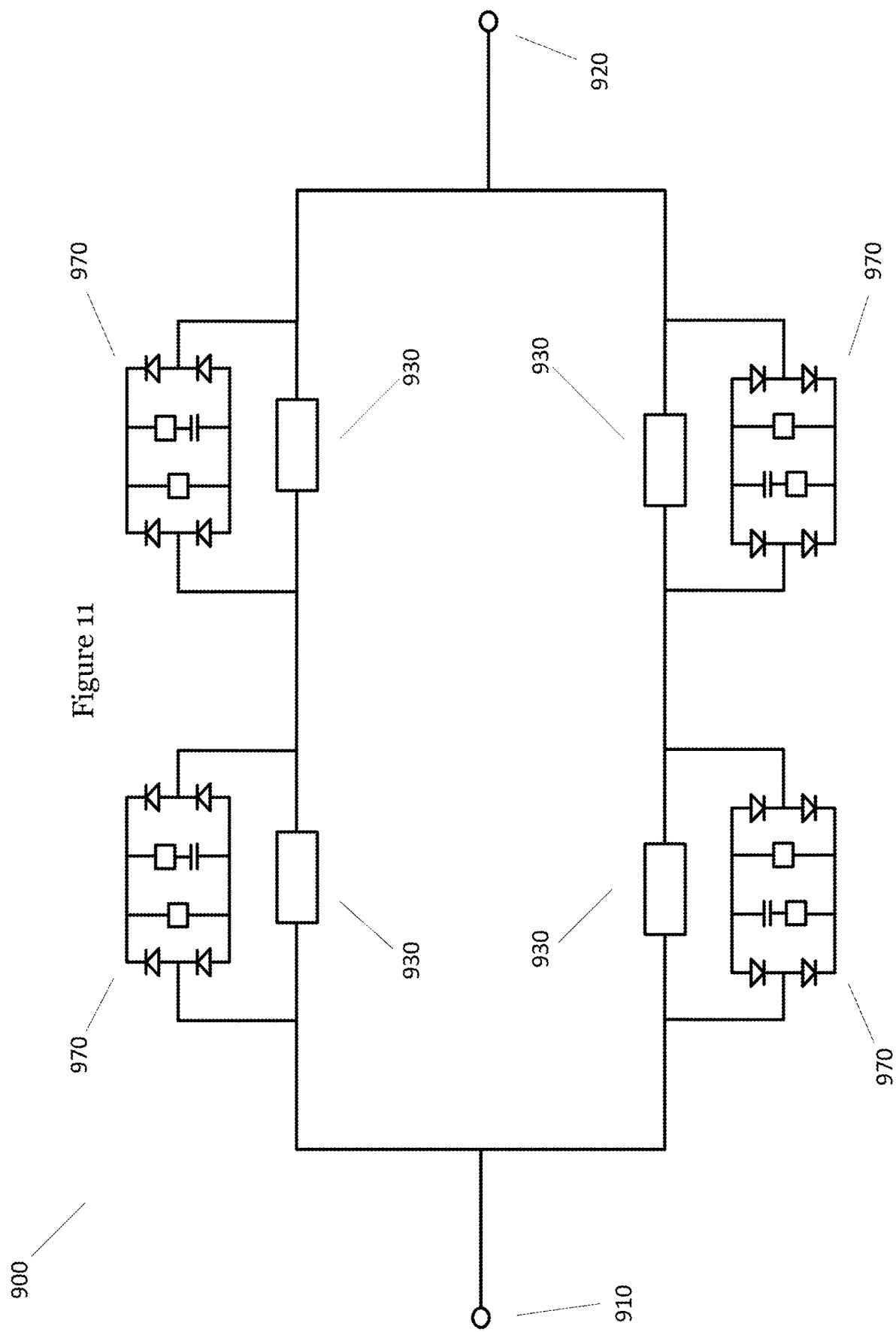
FIG. 11 shows a schematic illustration of an AC switching arrangement according to a ninth embodiment of the invention.

FIG. 11 shows a schematic illustration of an AC switching arrangement 900 according to a ninth embodiment of the invention.

This embodiment shows four switching units, each switching unit comprising a switching mechanism 930 and an energy transfer arrangement 970. However, other embodiments of the invention may use a different number of switching units connected in series and/or parallel.

Series connection of such switching units enables the withstanding of higher system voltages and higher energy levels during fault. Parallel connection of such switching units enables reducing losses in normal operation and carrying higher continuous currents.

The energy transfer arrangement 970 is shown as a one energy transfer branch configuration, but this is merely for ease of illustration. The switching mechanisms and energy transfer arrangements of any of the herein described mentioned embodiments could be combined in any combination.

The AC switching mechanism of any of the herein described embodiments may comprise a control mechanism (not shown) arranged to detect a fault condition. The control mechanism may be arranged to output one or more signals indicating a fault. For example, in this embodiment, the control mechanism may send signals that indicate the presence and/or absence of a fault to the switching mechanism.

Depending on how the various switches area arranged, the control mechanism may send a different number of signals.

In addition, the AC switching mechanism of any of the herein described embodiments may further comprises a current sensor (not shown) arranged to sense the current in the source and/or load terminals.

In normal conditions, the switching mechanism does not have a significant effect on the current or voltage between the source and load terminals. The control mechanism may be arranged to detect a fault based on a rise of the current in the source and/or load terminals, and the current sensor may be a current transformer. The fault detection system could be based on the AC circuit current in the source and/or load terminals and/or the AC circuit current rate of change. For example, a current transformer could be used to detect an increase in the AC current in the source and/or load terminals. For example, if the AC circuit current rises over 10-20% above the maximum normal level, and/or if the rate of change rises over 10-20% above the maximum normal level, a fault is detected. Any higher derivatives of the current can also be used (e.g., second derivative of current). A combination of these conditions may be used for detection as well.

In some embodiments, a control mechanism can be arranged to detect a fault based on a received signal from an external system (e.g. a remote fault detection system) and/or based on the reception of an operator command.

Embodiments of the invention can also provide an AC switching system comprising an AC switching arrangement according to any of embodiment of the invention; and a control mechanism (e.g. an external control mechanism) arranged to detect a fault condition on the AC grid; wherein on detection of the fault condition, the control mechanism is arranged to send a signal indicating a fault condition to the AC switching arrangement.

In some embodiments, on detection of the fault condition clearing, the control mechanism is arranged to send a signal indicating a recovery condition to the AC switching arrangement in order to put the switching mechanism back in the first state of current conduction. In some embodiments, the control mechanism comprises a current sensor arranged to detect a change in grid current. In some embodiments, the control mechanism comprises a voltage sensor arranged to detect a change in grid voltage. In some embodiments, the control mechanism is arranged to detect a fault on the basis of a received signal from an external device.

A comparison will now be made between examples according embodiments of the invention and some comparative examples with reference to a set of simulations.

In all these examples and comparative examples an AC grid is simulated with the same voltage source (11 kV system—line to line voltage), the same grid inductance, the same grid resistance and the same load resistance were used in all simulations. The load current was simulated as 1.87 kA RMS, and a prospective fault current was simulated as 6.25 kA RMS. In each simulation, a short circuit occurs at 91 ms and switching of the switching mechanism occurs at 93 ms.

COMPARATIVE EXAMPLE 1

In this comparative example, a conventional arrangement of the form shown in FIG. 1 was simulated. The clamping voltage of the arrester 15 was chosen to have a similar peak voltage to that of Example 1 and 2 (see below). Simulation results are shown in FIG. 12.

Figure 12:
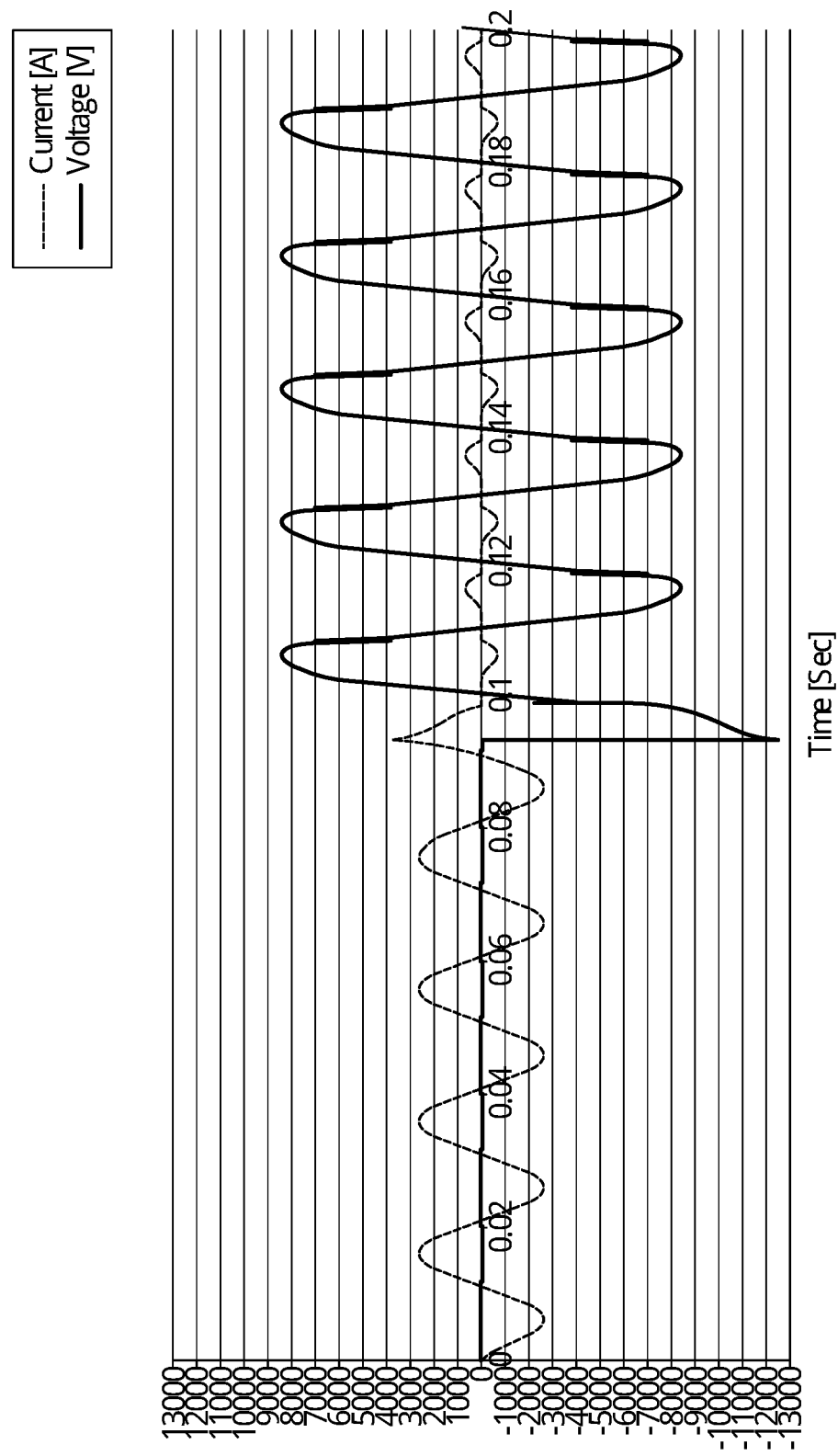
FIG. 12 shows simulation results for Comparative Example 1.

As shown in FIG. 12, because the arrester clamping voltage is too close to the network voltage, the current keeps flowing though the arrester during all the cycles after the switching event. As a result, if this occurred in a device, the arrester would fail in such a case (due to overheating). The current rapidly declines immediately when the switch 13 in FIG. 1 is turned OFF, but then there are continuous current peaks—relatively small ones but more than enough to cause the arrester 15 to fail.

COMPARATIVE EXAMPLE 2

In this comparative example, a conventional arrangement of the form shown in FIG. 1 was simulated. The value of the arrester 15 was chosen to have a clamping voltage set correctly (i.e. such that it would not fail due to repetitive current peaks through it). Simulation results are shown in FIG. 13.

Figure 13:
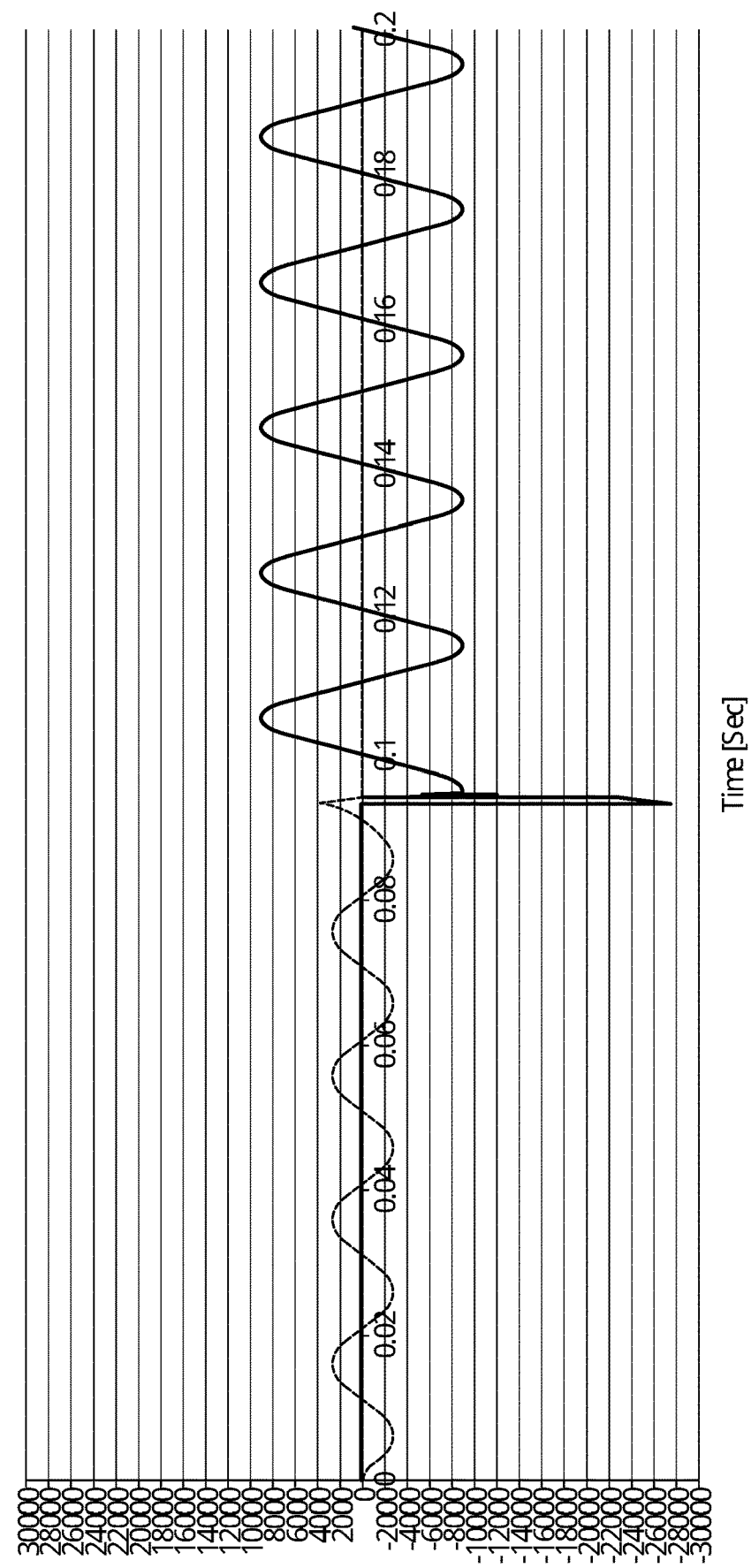
FIG. 13 shows simulation results for Comparative Example 2.

As shown in FIG. 13, there is no significant current flowing through the arrester 15 after the first transient (switching event) but there is a very high voltage peak (27.4 kV) which will require additional IGBTs/semiconductor switches to be designed in series to withstand this voltage. Also, this high voltage peak will stress the system. Current is rapidly declining immediately when the switch 13 is switched OFF as the energy stored in the grid is absorbed by the arrester and dissipated.

EXAMPLE 1

In this example, an embodiment of the invention of the form shown in FIG. 4 was simulated. Simulation results are shown in FIG. 14.

Figure 14:
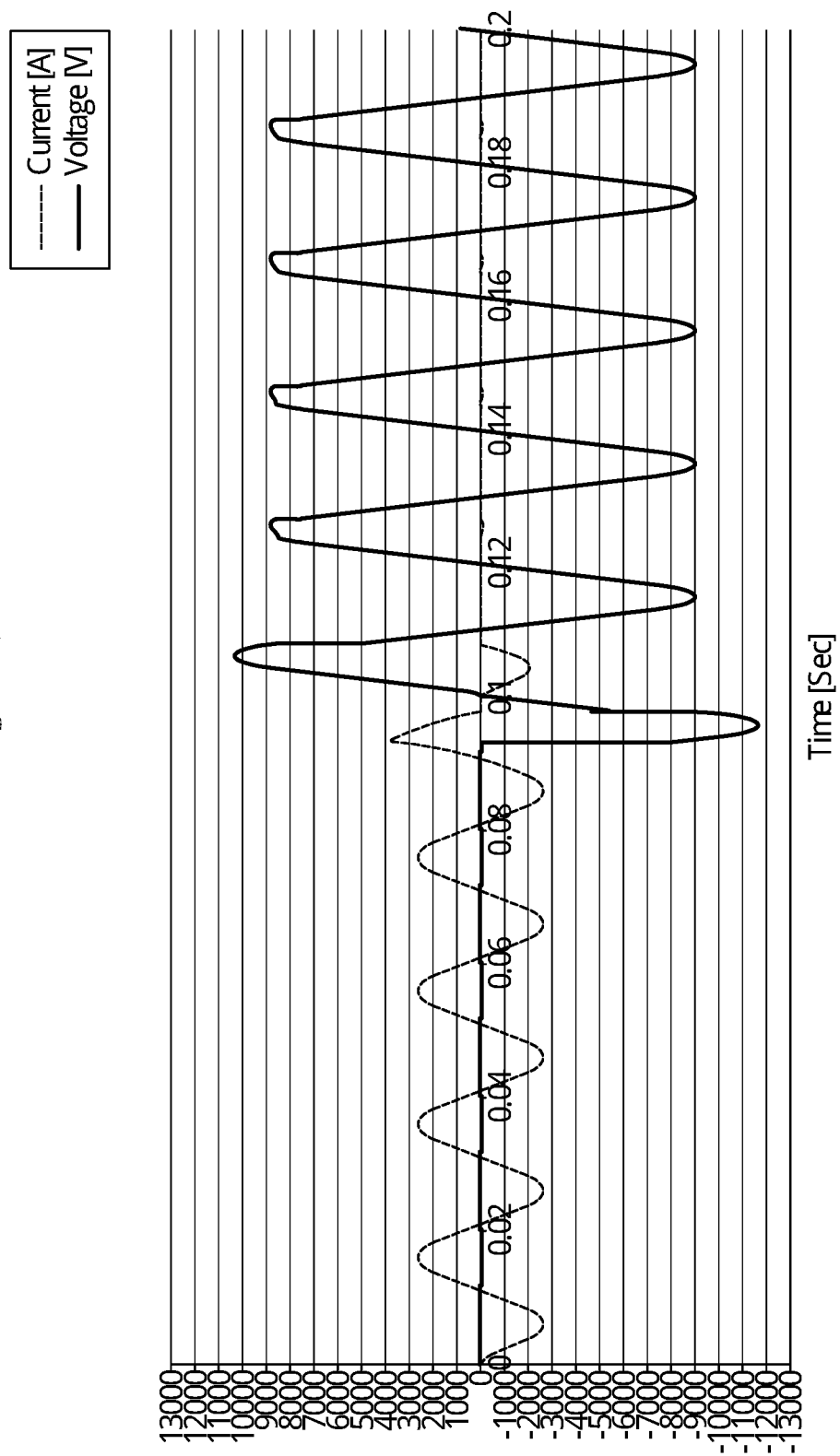
FIG. 14 shows simulation results for Example 1.

As shown in FIG. 14, the voltage is clamped to 11.6 kV, and no significant current is flowing through the switching arrangement after the first cycle of the short circuit event and the two energy transfer branches can safely withstand the event.

The first positive current peak (after short circuit event inception) and negative voltage peak are handled by one energy transfer branch and the first negative current peak and positive voltage peak are handled by the other energy transfer branch. Current is rapidly declining immediately when the first switch is switched OFF, and then there is an additional second smaller current peak (negative). After the action of each of the energy transfer branches, the current is practically interrupted.

It should be noted that although the energy stored in the grid inductance is effectively absorbed by the first energy transfer branch, the grid voltage source is still active and drives additional energy into the grid. This energy is absorbed by the second energy transfer branch, and once fully charged, current can no longer flow from the grid source.

EXAMPLE 2

In this example, an embodiment of the invention of the form shown in FIG. 6 was simulated. Simulation results are shown in FIG. 15.

Figure 15:
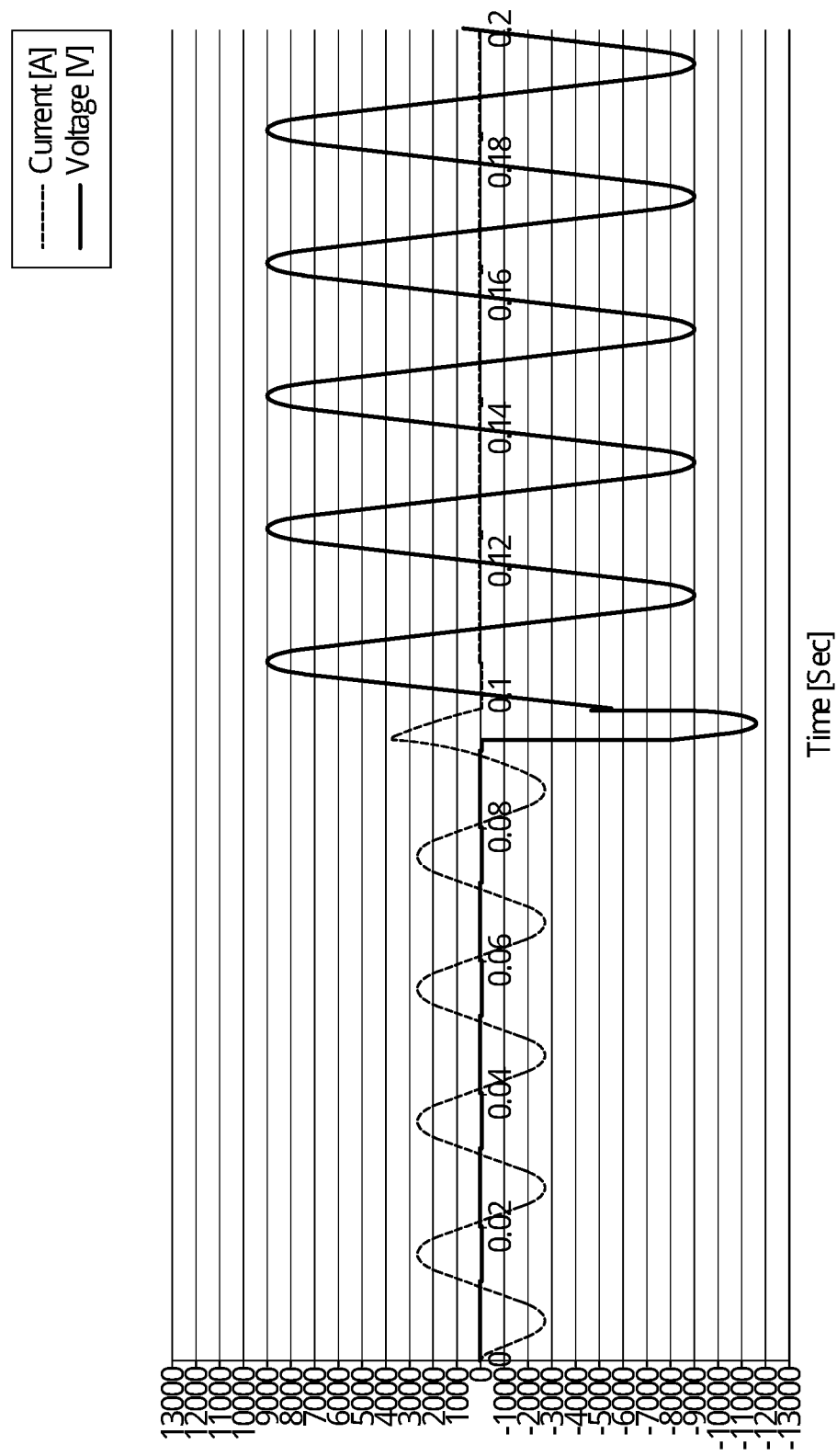
FIG. 15 shows simulation results for Example 2.

As shown in FIG. 15, the voltage is clamped to 11.6 kV, and no significant current is flowing through the switching arrangement after the first transient event of the short circuit and the energy transfer branch can safely withstand the event. There is only one current peak (a positive one) (after short circuit event inception). Current is rapidly declining immediately when the first switch is switched OFF, no additional current peaks. In this embodiment, due to the presence of a rectifier, the voltage stored in the capacitance after the first half cycle is also useful for blocking current in the next half cycle, as the capacitor is charged to a voltage equal or higher to the network voltage. This enables this embodiment to interrupt the current in one-shot.

Arresters are variable resistance elements generally used for very brief and intermittent surge response such as lightning impulse which is an event with duration measured in microseconds. As such their thermal design typically allows for slow natural cooling. In the type of use described in relation to Comparative Examples 1 and 2, arresters will typically heat up significantly. Therefore, arresters are typically designed for one-shot operation after which they need to cool down, and not for repetitive long strikes. It is still possible to achieve repetitive long strikes, but the arresters need to be significantly oversized or arrays of parallel and series arresters need to be used for withstanding higher energy.

It will be appreciated that, in practical arrangements, the normal operation voltage of the arrester (when expected not to conduct) needs to be substantially higher than the grid network voltage. If this is not the case, then during current interruption when the switching mechanism of Comparative Examples 1 and 2 is OFF, the arrester will conduct continuously which will cause them to fail due to overheating. Therefore, the clamping voltage of the arrester 15 needs to be selected significantly higher than the grid network voltage, which means that in practice the switching mechanism 13 needs to use a large number of series electronic switches. Using a large number of series electronic switches adds to the cost of the current interrupter 10 as well as increasing losses. Also, it will be appreciated that higher voltage on the grid is not desired. Also, in practice, conventional current interrupters using arresters need to use parallel connections of arresters which requires careful coordination so that they would share current.

Using an energy transfer arrangement to transfer energy from the grid to a capacitance arrangement without letting it return helps mitigate these issues. For example, unlike conventional arrangements, Examples 1 and 2 show lower voltages.

Hence, it is apparent that Examples 1 and 2 are advantageous when compared to Comparative Examples 1 and 2. In particular, the use of arresters to absorb all the grid energy (Comparative Examples 1 and 2) has a number of disadvantages compared to Examples 1 and 2 that use an energy transfer arrangement to transfer energy from the grid to a capacitance arrangement without letting it return.

COMPARATIVE EXAMPLE 3

Figure 2:
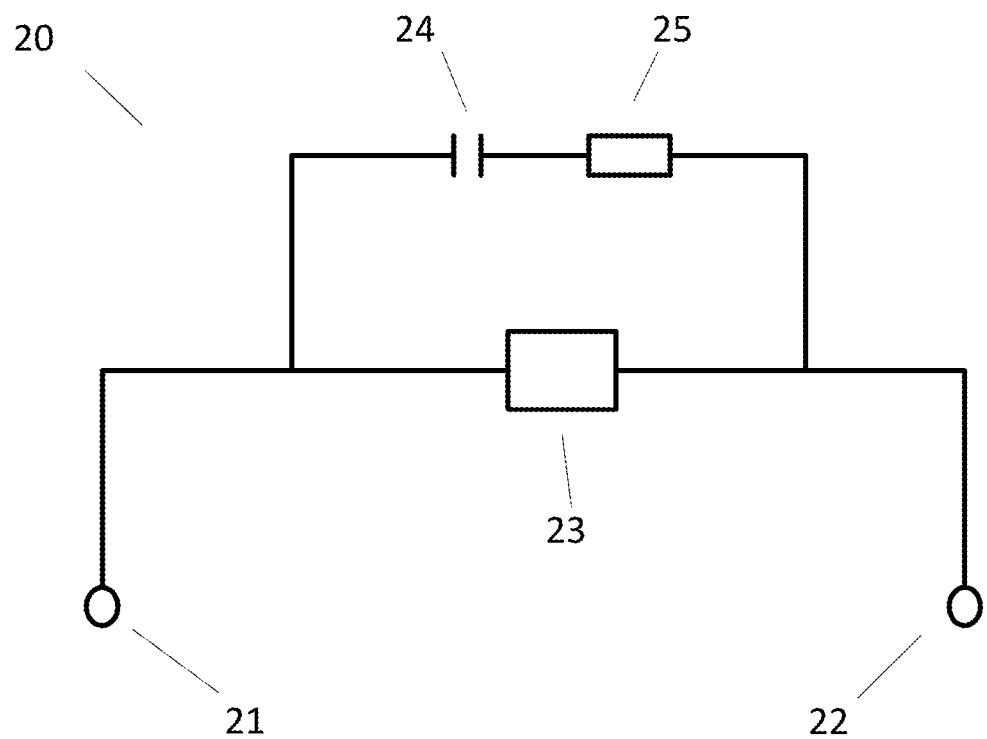
FIG. 2 shows a current interrupter according to a second arrangement.
Figure 16:
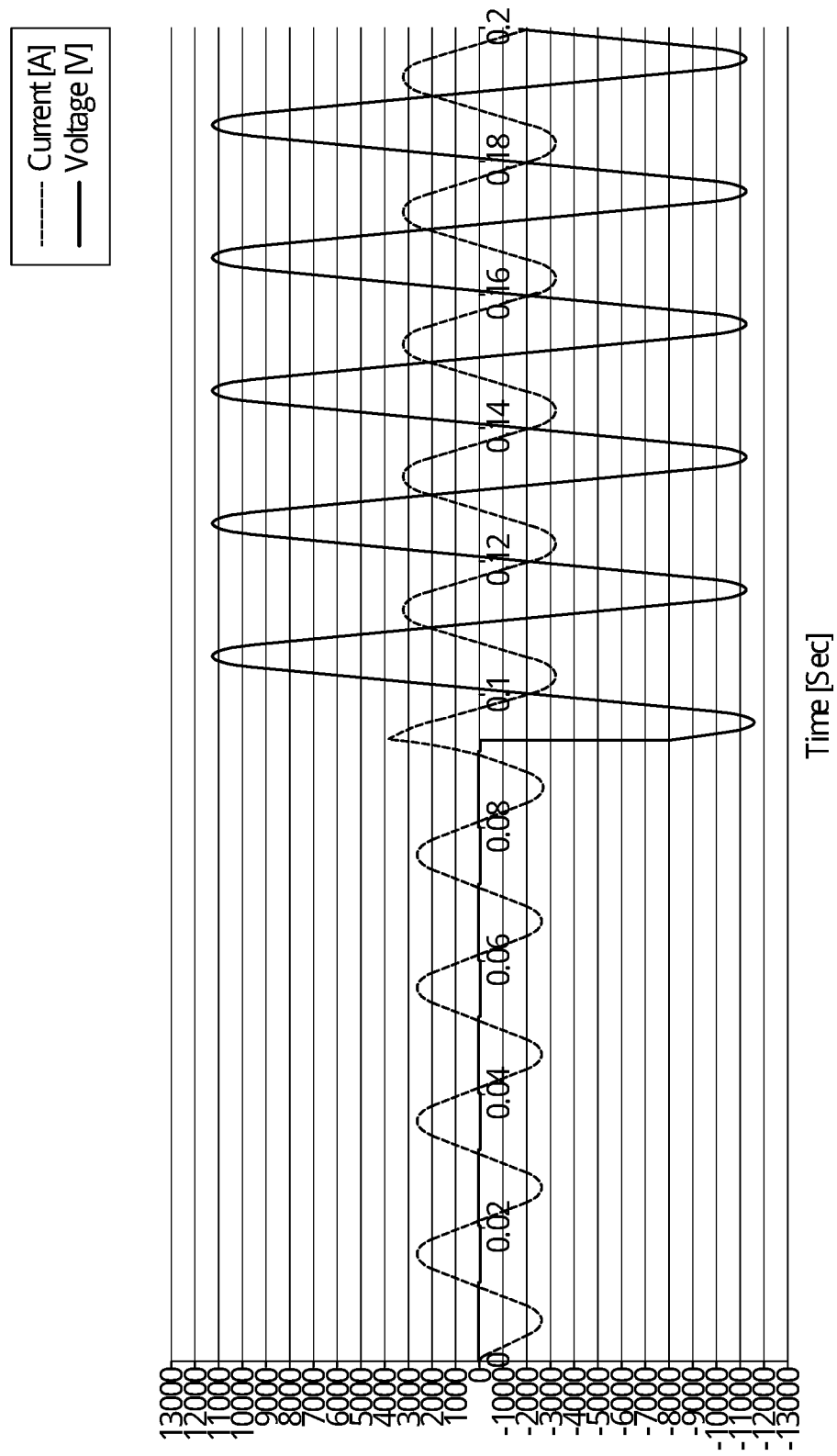
FIG. 16 shows simulation results for Comparative Example 3.

FIG. 2 shows a schematic illustration of an AC switching arrangement 20 according to an arrangement. In this comparative example, an arrangement of the form shown in FIG. 2 was simulated. Simulation results are shown in FIG. 16.

The AC switching arrangement 20 comprises a source terminal 21, a load terminal 22, a switching mechanism 23, a capacitance 24 and a resistance 25. The capacitance 24 and resistance 25 are connected in series with each other and in parallel to the switching mechanism 23.

Hence, the arrangement of FIG. 2 is similar to the arrangement of FIG. 6 (fourth embodiment) without the diode arrangement (i.e. first to fourth diodes).

In this comparative example, the value of the capacitance 24 was chosen to be the same as that of the capacitance in the energy transfer branch of Example 2 (i.e. equivalent to capacitance 475 in FIG. 6). The value of the resistance 25 was chosen to be the same as that of the series resistance in the energy transfer branch of Example 2 (i.e. equivalent to series resistance 476 in FIG. 6).

As shown in FIG. 16, while voltage is clamped also to 11.6 kV, significant current keeps flowing through the switching arrangement so that the current is not interrupted at all.

In addition, due to the high residual current (2.2 kA RMS), there is very large energy dissipation through the resistance 25. Hence, a very large value (and hence very expensive) resistor and cooling system would therefore be required.

COMPARATIVE EXAMPLE 4

In this comparative example, an arrangement of the form shown in FIG. 2 was simulated. Compared to Comparative Example 3, the value of the capacitance 24 was reduced by a factor of around eleven to minimize the residual current. Simulation results are shown in FIG. 17.

Figure 17:
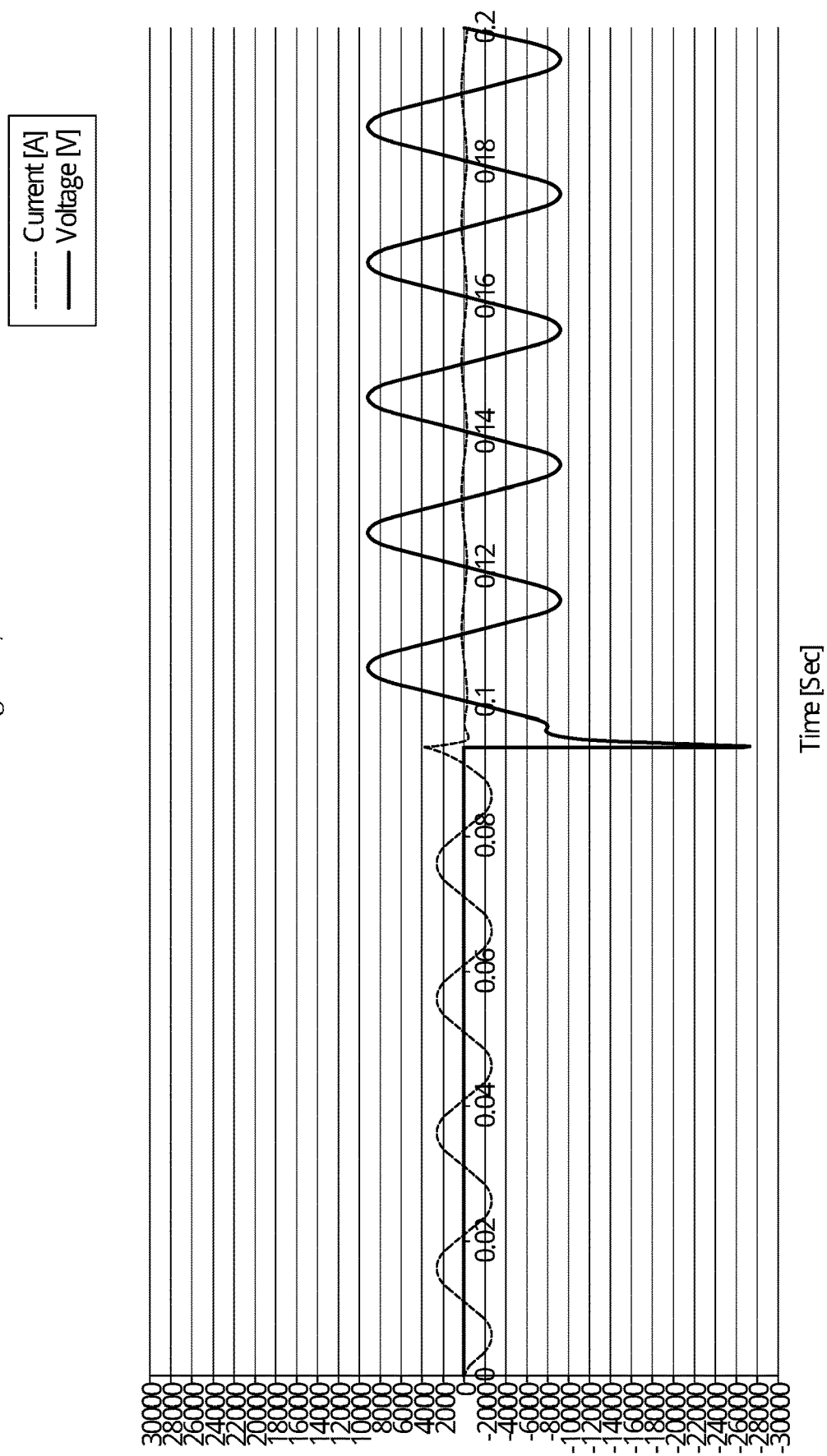
FIG. 17 shows simulation results for Comparative Example 4.

As shown in FIG. 17, the voltage peak is clamped to 27.3 kV while there is still a non-negligible residual current of 200 A RMS.

Hence, by comparing Comparative Example 3 and Comparative Example 4 to Examples 1 and 2, one can either get similar voltages to our invention but with very high residual current (so current interruption is not achieved) while substantially high levels of energy is dissipated through massive resistors and cooling systems, or either reduce the residual current (albeit to non-negligible level) with a trade-off of high voltage peak which requires addition of series connected electronic switches to withstand this high voltage, which adds to cost and operating losses.

When comparing Examples 1 and 2 to Comparative Examples 3 and 4, Examples 1 and 2 do not allow for energy to be returned to the network once it is captured in the energy transfer branch. Also, when switching back to the first state (i.e. first switch closed), Examples 1 and 2 do not cause high transient current on the switch and on the capacitor. Practical arrangements according to Examples 1 and 2 can use much higher capacitance compared to arrangements such as Comparative Examples 3 and 4. In arrangements such as Comparative Examples 3 and 4—a big capacitor will cause high current to flow after the first peak transient (as steady state), but this is avoided in according to Examples 1 and 2.

FIG. 18a shows a schematic illustration of an AC switching arrangement 1000a according to a tenth embodiment of the invention.

The AC switching arrangement 1000a comprises a source terminal 1010, a load terminal 1020, a switching mechanism 1030, and an energy transfer branch 1070. The AC switching arrangement 1000a is for connection to the AC grid.

In this embodiment, the switching mechanism 1030 comprises two back to back IGBT modules 1031, 1032 that are connected in series. Each IGBT module 1031, 1032 has a respective IGBT 1031a, 1032a and a respective integrally parallel connected diode 1031b, 1032b, with the diodes 1031b, 1032b connected with opposite polarities. The IGBTs 1031a, 1032a in this embodiment receive a control signal C1 to open/close the IGBTs 1031a, 1032a. The control signal C1 may come from a suitable controller (not shown) that may be either external or internal to the AC switching arrangement 1000a.

The energy transfer branch 1070 is connected in parallel with the switching mechanism 1030, and comprises a capacitance arrangement and a diode arrangement.

The capacitance arrangement comprises a capacitance 1075 having a first terminal 1075a and a second terminal 1075b.

The diode arrangement of this embodiment comprises first and second diodes 1071, 1072, each having an anode and a cathode.

The anode 1071a of the first diode 1071 is connected to the source terminal 1010, and the cathode 1071b of the first diode 1071 is connected to the first terminal 1075a of the capacitance 1075. The anode 1072a of the second diode 1072 is connected to the load terminal 1020, and the cathode 1072b of the second diode 1072 is also connected to the first terminal 1075a of the capacitance 1075.

The second terminal 1075b of the capacitance 1075 is connected to a node 1033 that is between the series connected back IGBT modules 1031, 1032.

Hence, in this embodiment, instead of using a full wave rectifier (as in the embodiments of FIGS. 5 and 6, for example), the energy transfer branch can be implemented using two diodes, and can rely on the internal diodes mounted inside the IGBT module to form the rectifier. In order to do this, the capacitance 1075 is connected to the mid-point between the IGBT modules 1031, 1032. During normal operation the capacitance is essentially discharged (when the IGBTs are ON).

When the switching mechanism 1030 is open (i.e. in an OFF state), in each half cycle, energy from the grid can be transferred to the capacitance arrangement (i.e. the capacitance 1075 in this embodiment) but is prevented from being returned to the grid by the diode arrangement (i.e. the first diode 1071 and second diode 1072).

Hence, when the switching mechanism 1030 opens, the capacitance 1075 will begin being charged (not depending on the half cycle polarity). Once the capacitance 1075 is fully charged (the voltage may be higher than the grid voltage) the current flowing on the energy transfer branch 1070 will stop. Hence, when compared to the two branch embodiments mentioned above, this (and other) single branch embodiments can stop the current flow within one half cycle.

Hence, the AC switching arrangement 1000a can interrupt the current between the source terminal 1010 and the load terminal 1020.

FIG. 18b shows a schematic illustration of an AC switching arrangement 1000b according to a variant of the tenth embodiment of the invention. The AC switching arrangement 1000b comprises a source terminal 1010, a load terminal 1020, a switching mechanism 1030, and an energy transfer branch 1070. The AC switching arrangement 1000b is for connection to the AC grid.

In this embodiment, the AC switching arrangement 1000b is illustrated as being substantially the same as the AC switching arrangement 1000a mentioned above in relation to FIG. 18a, however with the addition of a series resistor 1076 and a parallel resistor 1077.

The series resistor 1076 is connected between the first terminal 1075a of the capacitance 1075 and the cathodes 1071b, 1072b of the first and second diodes 1071, 1072.

The series resistance 1076 is provided to dissipate some of the stored grid energy. This can also enable less energy to be transferred to the capacitance 1075. The series resistance 1076 can also help to reduce transient voltages and reduce the current interruption duration.

The parallel resistor 1077 is connected in parallel to the series resistor 1076 and the capacitance 1075. In other embodiments, a parallel resistance may be connected in parallel with the capacitance 1075 and not in parallel with the series resistance 1076.

The parallel resistance 1077 provides a discharge path for the stored energy in the capacitance 1075. Furthermore, the value of the parallel resistance 1077 determines the time constant of the capacitance 1075. An important benefit of the parallel resistance is the ability to start dissipating the energy stored in the capacitance immediately as it starts accumulating in the capacitor. This can expedite the recovery time of the system, to be ready for a subsequent interruption operation and promptly reduce the voltage stress on the system.

FIG. 18*c* shows a schematic illustration of an AC switching arrangement 1000*c* according to a variant of the tenth embodiment of the invention. The AC switching arrangement 1000*c* comprises a source terminal 1010, a load terminal 1020, a switching mechanism 1030, and an energy transfer branch 1070. The AC switching arrangement 1000*c* is for connection to the AC grid.

In this embodiment, the AC switching arrangement 1000*c* is illustrated as being substantially the same as the AC switching arrangement 1000*a* mentioned above in relation to FIG. 18*a*, however with the addition of an arrester 1091.

The arrester 1091 is connected in parallel to the switching mechanism 1030. The arrester 1091 may be selected to absorb a substantial portion of the energy when switching OFF the switches of the switching mechanism 1030. However, the combination of the arrester and the diode and capacitor arrangement has the advantage of reducing the voltage rate of rise when the IGBTs are switched off when compared to using an arrester without the diodes and capacitance. If the voltage rate of rise is too high, it may interfere with the electronic switches (e.g., IGBTs) operation.

Also, in variants of this embodiment, a series resistance may be placed in series with the capacitance 1075. In other words, a resistance equivalent to series resistance 1076 (shown in FIG. 10*b*) may be provided. Likewise, in variants of this embodiment, a parallel resistance may be placed in series with the capacitance 1075. In other words, a resistance equivalent to parallel resistance 1077 (shown in FIG. 10*b*) may be provided.

FIG. 19 shows a schematic illustration of an AC switching arrangement 1100 according to an eleventh embodiment of the invention. This arrangement is suitable for grids with solid grounding, but may also be useful for other grid arrangements.

The AC switching arrangement 1100 comprises a source terminal 1110, a load terminal 1120, a switching mechanism 1030, and an energy transfer branch 1170. The AC switching arrangement 1100 is for connection to the AC grid.

In this embodiment, the switching mechanism 1130 comprises two back to back IGBT modules 1131, 1132 that are connected in series. Each IGBT module 1131, 1132 has a respective IGBT 1131*a*, 1132*a* and a respective parallel connected diode 1131*b*, 1132*b*, with the diodes 1131*b*, 1132*b* connected with opposite polarities. The IGBTs 1131*a*, 1132*a* in this embodiment receive a control signal C1 to open/close the IGBTs 1131*a*, 1132*a*. The control signal C1 may come from a suitable controller (not shown) that may be either external or internal to the AC switching arrangement 1100.

The energy transfer branch 1170 is connected in parallel with the switching mechanism 1130, and comprises a capacitance arrangement and a diode arrangement.

The capacitance arrangement comprises a capacitance 1175 having a first terminal 1175*a* and a second terminal 1175*b*.

The diode arrangement of this embodiment comprises first and second diodes 1071, 1072, each having an anode and a cathode.

The anode 1171*a* of the first diode 1171 is connected to the source terminal 1110 and the cathode 1171*b* of the first diode 1171 is connected to the first terminal 1175*a* of the capacitance 1175. The anode 1172*a* of the second diode 1172 is connected to the load terminal 1120 and the cathode 1172*b* of the second diode 1172 is also connected to the first terminal 1175*a* of the capacitance 1175.

The second terminal 1175*b* of the capacitance 1175 is connected to a ground 1190. Hence, when compared to the embodiments of FIGS. 18*a*-18*c*, the capacitance is not connected between the IGBTs.

The IGBT 1131*a*, 1132*a* (i.e. first and second switches) are arranged to open and close at the same time. When the switching mechanism 1130 is open (i.e. in an OFF state), in each half cycle, energy from the grid can be transferred to the capacitance arrangement (i.e. the capacitance 1175 in this embodiment) but is prevented from being returned to the grid by the diode arrangement (i.e. the first diode 1171 and second diode 1172).

Hence, when the switching mechanism 1130 opens, the capacitance 1175 will begin being charged (not depending on the half cycle polarity). Once the capacitance 1175 is fully charged (the voltage may be higher than the grid voltage) the current flowing on the energy transfer branch 1170 will stop. Hence, when compared to the two branch embodiments mentioned above, this (and other) single branch embodiments can stop the current flow within one half cycle and typically within 1-3 milliseconds.

Hence, the AC switching arrangement 1100 can interrupt the current between the source terminal 1110 and the load terminal 1120.

In variants of this embodiment, a series resistance may be placed in series with the capacitance 1175. Likewise, in variants of this embodiment, a parallel resistance may be placed in parallel with the capacitance 1175 (or in parallel with the capacitance 1175 and the series resistance).

FIG. 20 shows a schematic illustration of an AC switching arrangement 1200 according to a twelfth embodiment of the invention.

The AC switching arrangement 1200 of this embodiment is for a three phase grid, and respectively comprises for each phase R, S, T: a source terminal 1210R, 1210S, 1210T; a load terminal 1220R, 1220S, 1220T; a switching mechanism 1230R, 1230S, 1230T. The AC switching arrangement 1200 also comprises an energy transfer branch 1270 that has two sub-branches for each phase: 1270Ra, Rb, 1270Sa, 1270Sb, 1270Ta, 1270Tb.

In this embodiment, the switching mechanism 1230R, 1230S, 1230T of each phase comprises four back to back IGBT-pair modules (each module has 2 back to back IGBTs) that are connected in series. However, in other embodiments, the switching mechanism 1230R, 1230S, 1230T of each phase could be implemented by other numbers and types of switches.

The energy transfer branch 1270 has first and second sub-branches 1270Ra, Rb, 1270Sa, 1270Sb, 1270Ta, 1270Tb for each phase, with the first and second sub-branches being connected either side of their respective switching mechanism 1230R, 1230S, 1230T.

The energy transfer branch 1270 comprises a capacitance arrangement and a diode arrangement. The capacitance arrangement comprises a capacitance 1275 having a first terminal 1275*a* and a second terminal 1275*b*.

The diode arrangement of this embodiment comprises a first three phase rectifier 1278 and a second three phase rectifier 1279.

The first three phase rectifier 1278 has a first node 1278*a* connected to the second terminal 1275*b* of the capacitance 1275, and a second node 1278*b* connected to the first terminal 1275*a* of the capacitance 1275.

The second three phase rectifier 1279 has a third node 1279*a* connected to the first terminal 1275*a* of the capacitance 1275, and a fourth node 1279*b* connected to the second terminal 1275*b* of the capacitance 1275. Hence, the capacitance 1275 is shared for all the three phases.

The first three phase rectifier 1278 comprises, for each of the three phases: a first diode 1271R, 1271S, 1271T and a second diode 1271R, 1271S, 1271T that are connected in series.

Considering the R phase, the anode 1271Ra of the first diode 1271R is connected to the first node 1278*a*, and the cathode 1271Rb of the first diode 1271R is connected to the anode 1272Ra of the second diode 1272R. The cathode 1272Rb of the second diode 1272R is connected to the second node 1278*b*. The first sub-branch 1270Ra for the R phase connects the source terminal 1210R to a node (not labelled) between the cathode 1271Rb of the first diode 1271R and the anode 1272Ra of the second diode 1272R. The T and S phases are connected in a corresponding way.

The second three phase rectifier 1279 comprises, for each of the three phases: a third diode 1273R, 1273S, 1273T and a fourth diode 1274R, 1274S, 1274T that are connected in series.

Considering the R phase, the anode 1273Ra of the third diode 1273R is connected to the fourth node 1279*b*, and the cathode 1273Rb of the third diode 1273R is connected to the anode 1274Ra of the fourth diode 1274R. The cathode 1274Rb of the fourth diode 1274R is connected to the third node 1279*a*. The second sub-branch 1270Rb for the R phase connects the load terminal 1220R to a node (not labelled) between the cathode 1273Rb of the third diode 1273R and the anode 1274Ra of the fourth diode 1274R. The T and S phases are connected in a corresponding way.

Hence, this embodiment relies on using all three phases together with a single energy absorption circuit.

In this embodiment, the first three phase rectifier 1278 is connected to the input phase terminals 1210R, 1210S, 1210T, and the second three phase rectifier 1279 is connected to the output phase terminals 1212R, 1212S, 1212T.

The capacitance 1275 is connected to the two three phase rectifiers in a way that produces a DC voltage on it with the same polarity, regardless of the polarity of the AC voltages. As drawn in FIG. 20—terminal 1275*a* will have a positive voltage vs. terminal 1275*b*.

In this arrangement, when the switches are switched off, the energy stored in the grid inductance and the energy supplied by the grid source will charge the capacitance 1275. The energy cannot flow back from the capacitance 1275 to the grid.

In other embodiments, a parallel resistor can be added to discharge the capacitance 1275 after current interruption. Alternatively, an electronic switch can be placed in parallel with the capacitance 1275 and discharge it upon command after the current interruption.

In other embodiments, a series resistor can be added to the capacitance 1275 to allow partitioning of energy absorption between the capacitance 1275 and the resistance. This embodiment offers a key advantage in having a single energy absorption arrangement for all 3 phases together, resulting in reduced component count and cost.

In variants of this embodiment, a series resistance may be placed in series with the capacitance 1275. Likewise, in variants of this embodiment, a parallel resistance may be placed in parallel with the capacitance 1275.

FIG. 21 shows a schematic illustration of an AC switching arrangement 1300 according to a thirteenth embodiment of the invention. This arrangement is suitable for grids with solid grounding, but may also be useful for other grid arrangements.

The AC switching arrangement 1300 of this embodiment is for a three phase grid, and respectively comprises for each phase R, S, T: a source terminal 1310R, 1310S, 1310T; a load terminal 1320R, 1320S, 1320T; a switching mechanism 1330R, 1330S, 1330T. An energy transfer branch 1370 is provided that has three sub-branches 1370R, 1370S, 1370T, one for each phase.

The energy transfer branch 1370 has three sub-branches 1370R, 1370S, 1370T, each connected either side of its corresponding switching mechanism 1330R, 1330S, 1330T.

The energy transfer branch 1370 comprises a capacitance arrangement and a diode arrangement. The capacitance arrangement comprises a capacitance 1375 having a first terminal 1375*a* and a second terminal 1375*b*.

The diode arrangement of this embodiment respectively comprises a first diode 1371R, 1371S, 1371T and a second diode 1372R, 1372S, 1372T on each of the three sub-branches 1370R, 1370S, 1370T.

Considering the R phase, the anode 1371Ra of the first diode 1371R is connected to the source terminal 1310R and the cathode 1371Rb of the first diode 1371R is connected to the first terminal 1375*a* of the capacitance 1375. The anode 1372Ra of the second diode 1372R is connected to the load terminal 1320R and the cathode 1372Rb of the second diode 1372R is also connected to the first terminal 1375*a* of the capacitance 1375. The second terminal 1375*b* of the capacitance 1375 is connected to ground 1390. The T and S phases are connected in the same way.

This embodiment operates in a similar way to the embodiment of FIG. 20, but with the single capacitance 1375 connected to ground.

The availability of the ground connection enables using half of the diodes compared to the embodiment of FIG. 20, further reducing the part count and cost.

In variants of this embodiment, a series resistance may be placed in series with the capacitance 1375. Likewise, in variants of this embodiment, a parallel resistance may be placed in parallel with the capacitance 1375.

FIG. 22 shows a schematic illustration of an AC switching arrangement 1400 according to a fourteenth embodiment of the invention. This arrangement is suitable for grids with solid grounding, but may also be useful for other grid arrangements.

The AC switching arrangement 1400 of this embodiment is for a single phase grid, and comprises a source terminal 1410, a load terminal 1420R, 1420S, 1420T; a switching mechanism 1430, and an energy transfer branch 1470.

The energy transfer branch 1470 comprises a capacitance arrangement and a diode arrangement. The capacitance arrangement comprises a capacitance 1475 having a first terminal 1475*a* and a second terminal 1475*b*.

The diode arrangement of this embodiment comprises a first diode 1471 and a second diode 1472 on either side of the switching mechanism 1430.

The anode 1471*a* of the first diode 1471 is connected to the source terminal 1410 and the cathode 1471R of the first diode 1471 is connected to the first terminal 1475a of the capacitance 1475. The anode 1472a of the second diode 1472 is connected to the load terminal 1420 and the cathode 1472b of the second diode 1472 is also connected to the first terminal 1475a of the capacitance 1475. The second terminal 1475b of the capacitance 1475 is connected to ground 1490.

This embodiment operates in a similar way to the embodiment of FIG. 21, but with a single phase. This embodiment is therefore similar to the embodiment of FIG. 19.

In variants of this embodiment, a series resistance may be placed in series with the capacitance 1475. Likewise, in variants of this embodiment, a parallel resistance may be placed in parallel with the capacitance 1475.

FIG. 23 shows simulation results for an example according to the twelfth embodiment of the invention.

Initially normal current flows through the switching system and the voltage drop on it is negligible. Shortly after fault inception, the fault is detected and a command is sent to the switching elements to switch off. The current through the switches stops within 5-50 microseconds, and the current transfers to the energy absorption arrangement. The capacitance is being charged until the voltage on it is high enough to stop the current from flowing (typically after 1-2 milliseconds). At this point, the switching system has reduced the current completely and therefore the entire grid voltage drops on the switching system.

In FIG. 23, the load current was simulated as 330 A RMS, and a prospective fault current was simulated as 1.35 kA RMS. In the simulation, fault current inception was at 30 ms, and switching occurs at 31.6 ms.

FIG. 24 shows simulation results for an example related to the use of a series resistor connected in series with the capacitance. This example is for an embodiment as shown in FIG. 6 (fourth embodiment) both with and without the series resistance 476. In other words, it shows simulation results for the fourth embodiment (FIG. 6) and simulation results for a variant of the fourth embodiment without the series resistance 476.

The graph in FIG. 24 compares simulations with the series and without the series resistance, with all other parameters are kept the same in both simulations. The solid line in FIG. 24 shows result with a series resistor of 2.1 Ohm, and the dashed line without series resistor (0 Ohm). In both cases, same the capacitance 475 of 1140 mF, and the same parallel resistance 477 (look) were used.

The comparison shows that with series resistance the overvoltage peak is greatly reduced and there is no fault current overshoot after switching OFF as in the case without series resistor.

As discussed, embodiments of the invention transfer energy from the AC grid to a capacitance. In variants of any of the herein described embodiments, the capacitance may be pre-charged with the same polarity as it would be charged by the AC grid when the switching mechanism is open. For example, the capacitance may be pre-charged to a voltage (e.g. above 5% of the network rated peak voltage). When the capacitance is pre-charged, in some applications, less energy will flow from the grid into the capacitance until the current is stopped, when compared to a fully discharged capacitance. This can enable faster interruption of the current, reduced transient overvoltage, and subsequently using capacitors with lower voltage rating which are smaller and cheaper.

Pre-charging the capacitance may be done either by a dedicated charging circuit connected to the capacitance, or by brief interruptions (e.g. 10 to 500 micro seconds) of the network current by the switching elements, which would gradually raise the voltage on the capacitance to the desired level.

In other words, the AC switching arrangement of some embodiments may comprise a pre-charge circuit for pre-charging the capacitance while in the first state (i.e. first switch closed). The pre-charging circuit may, for example, be a circuit supplying DC power as shown in FIG. 25.

FIG. 25 shows a pre-charging circuit 1501 for use with an example capacitance 1575 for use in any embodiment of the invention. The pre-charging circuit 1500a in this embodiment comprises a DC power supply 1501a. The DC power supply 1501a can pre-charge the capacitance 1575 to a desired pre-charge voltage (e.g. above 5% of the network rated peak voltage) and disconnect after the pre-charging process is completed.

In other embodiments, the AC switching arrangement may further comprise a pre-charge controller arranged to control the switching mechanism to pre-charge the capacitance by opening and then re-closing the first switch in a predetermined time. This may be done repeatedly (e.g. once a cycle for a number of cycles) until a desired pre-charge voltage is achieved.

FIG. 26 shows an AC switching arrangement 1600a according to an embodiment of the invention with a pre-charge controller 1699. The AC switching arrangement 1600a shown in FIG. 26 is the same as described above in relation to FIG. 18a (and hence will not be described again) with the addition of the pre-charge controller 1699. However, a pre-charge controller could be with any of the herein described embodiments.

In this embodiment, the switching mechanism 1630 comprises two back to back IGBTs 1631a, 1632a that can receive a control signal C1 to open/close the IGBTs 1631a, 1632a. The pre-charge controller 1699 is able to provide this control signal C1.

By providing a control signal C1 to open the IGBTs 1631a, 1632a, and then providing a control signal C1 to close the IGBTs 1631a, 1632a, the voltage on the capacitance (not shown) can be increased. Hence, the capacitance can be pre-charged to a desired voltage level.

It will be appreciated some embodiments act as a current limiting interrupter and comprise a control mechanism arranged to detect a fault condition on the AC grid, with the control mechanism providing the signal indicating a fault condition to the AC switching arrangement (e.g. control signal C1). In such embodiments, both the control mechanism arranged to detect a fault condition on the AC grid and the pre-charge controller 1699 may provide the control signal C1 to open/close the IGBTs 1631a, 1632a. Alternatively, the control mechanism and the pre-charge controller may be provided by the same device.

FIG. 27 shows simulation results for an example related to the use of pre-charging the capacitance. This example is for an embodiment of the type shown in FIG. 6, both with and without pre-charging the capacitance 475.

The solid line shows results for no pre-charging the capacitance (i.e. 0 V), and the dashed lines shows results for pre-charging the capacitance to 9 kV, where the network rated peak voltage is also 9 kV.

As can be seen, pre-charging current overshoot and transient overvoltage are significantly reduced.

In FIGS. 24 and 27, the load current was simulated as 1.87 kA RMS, and a prospective fault current was simulated as 6.25 kA RMS. In each simulation, a short circuit occurs at 91 ms and switching of the switching mechanism occurs at 93 ms.

FIG. 28 shows a fault current limiting interrupter 1703 according to an embodiment of the invention. This embodiment shows the fault current limiting interrupter 1703 including an AC switching arrangement 1700 and a control mechanism 1702 arranged to detect a fault condition on the AC grid.

The AC switching arrangement 1700 shown in FIG. 28 is the same as described above in relation to FIG. 6 (and hence will not be described again). However, in other embodiments, any of the herein discussed AC switching arrangements could be used as part of a fault current limiting interrupter.

On detection of the fault condition, the control mechanism 1702 is arranged to send a signal indicating a fault condition to the AC switching arrangement 1700. For example, in this embodiment, the signal indicating a fault condition is a control signal C1 to open the IGBTs 1731a, 1732a.

Following a fault condition clearing, the control mechanism 1702 is arranged to send a signal indicating a recovery condition to the AC switching arrangement 1700. For example, in this embodiment, the signal indicating a recovery condition may be control signal C1 to close the IGBTs 1731a, 1732a.

In some embodiments, the control mechanism 1702 comprises a current sensor arranged to detect a change in current. Such a current sensor may sense the incoming (terminal 1710) or outgoing (terminal 1720) current and/or current derivatives, and the control mechanism 1702 may open the switching mechanism 1730 upon fault detection based on this current signal.

In some embodiments, the control mechanism 1702 comprises a voltage sensor arranged to detect a change in grid voltage.

In some embodiments, the control mechanism 1702 is arranged to detect a fault on the basis of a received signal from an external device.

In some embodiments, such a control mechanism may act as a pre-charge controller as described above.

Embodiments of the invention may use such a control mechanism with any of the herein described AC switching arrangements.

Embodiments of the invention may provide an AC switching arrangement with an energy transfer arrangement connected in parallel with a switching mechanism, with the energy transfer arrangement comprising a capacitance arrangement and a diode arrangement. The switching mechanism is normally closed (switched ON) in a first state, and on reception of a signal indicating the second state, the switching mechanism is arranged to open (switch OFF). When the switching mechanism is in the second state, the diode arrangement is arranged in each AC half cycle to enable energy (source energy and stored inductance energy) to transfer from the grid to the capacitance arrangement but to prevent energy transfer from the capacitance arrangement back to the grid.

The energy transfer arrangement may have one or more energy transfer branches, and the capacitance arrangement and diode arrangement may be configured in various ways. For example, in configurations with two energy transfer branches, the diode arrangement may comprise one or more diodes having opposite polarities in each energy transfer branch, and the capacitance arrangement may comprise a capacitance (e.g. one or more capacitors) in each energy transfer branch. As mentioned above, different combinations of series and/or parallel resistances may also be provided for each energy transfer branch. In addition, such embodiments can include one or more arresters connected in parallel with the switching mechanism and/or the capacitance of each energy transfer branch. The two energy transfer branches may have the same configuration or may have different configurations.

In configurations with one energy transfer branch, the diode arrangement may comprise diodes in a rectifier configuration (for example), and the capacitance arrangement may comprise a capacitance (e.g. one or more capacitors). As mentioned above, different combinations of series and/or parallel resistances may also be provided for the energy transfer branch. In addition, such embodiments can include one or more arresters connected in parallel with the switching mechanism and/or the capacitance.

Embodiments of the invention may also provide a current limiting interrupter comprising: an AC switching arrangement according to any of the herein described embodiments; and a control mechanism arranged to detect a fault condition on the AC grid; wherein on detection of the fault condition, the control mechanism is arranged to send a signal indicating a fault condition to the AC switching arrangement. AC switch systems (current interrupters) may have different parameters (e.g., capacitances, resistances, number of IGBTs and overvoltage rating).

Many further variations and modifications will suggest themselves to those versed in the art upon making reference to the foregoing illustrative embodiments, which are given by way of example only, and which are not intended to limit the scope of the invention, that being determined by the appended claims.

The invention claimed is:

1. An AC switching arrangement for connection to an AC grid, the AC switching arrangement comprising:
   a first grid terminal connectable to a first node in the AC grid and a second grid terminal connectable to a second node in the AC grid;
   a switching mechanism connected in series between the first grid terminal and the second grid terminal, wherein the first switching mechanism includes a first switch, and wherein the first switch is closed in a first state and open in a second state;
   an energy transfer arrangement connected in parallel with the first switch, the energy transfer arrangement comprising a capacitance arrangement and a diode arrangement;
   wherein, on reception of a signal indicating the second state, the switching mechanism is arranged to open the first switch;
   wherein, when the first switch is in the second state, the diode arrangement is arranged in each AC half cycle to enable energy to transfer from the AC grid to the capacitance arrangement but to prevent energy transfer from the capacitance arrangement back to the AC grid,
      wherein the switching mechanism comprises a first switch and a second switch connected in series, wherein the first and second switches are arranged to open and close at the same time;
      wherein the diode arrangement comprises first and second diodes, each having an anode and a cathode, and the capacitance arrangement comprises a capacitance having a first terminal and a second terminal,
      wherein the anode of the first diode is connected to the first grid terminal and the cathode of the first diode is connected to the first terminal of the capacitance, and wherein the anode of the second diode is connected to the second grid terminal and the cathode of the second diode is connected to the first terminal of the capacitance;

wherein the second terminal of the capacitance is connected to a node that is between the series connected first and second switches; and wherein the first and second switches respectively comprise IGBT modules.

2. The AC switching arrangement according claim 1, wherein the energy transfer branch further comprises a parallel resistance connected in parallel with the capacitance arrangement; and/or wherein the energy transfer branch further comprises an arrester connected in parallel with the capacitance arrangement; and/or wherein the energy transfer branch further comprises a series resistance connected in series with the capacitance arrangement, optionally wherein the energy transfer branch further comprises an arrester connected in parallel with the capacitance arrangement and the series resistance.

3. The AC switching arrangement according to claim 1, wherein the switching mechanism comprises a snubber in parallel with the first switch; and/or wherein the switching mechanism comprises a second switch in series with the first switch; and/or a third switch in parallel with the first switch, wherein the switching mechanism comprises a plurality of series and parallel connected switches; and/or wherein the first switch comprises an electronic switch, and wherein the switching mechanism comprises a parallel mechanical switch connected in parallel with the first switch, and wherein the parallel mechanical switch is closed in the first state and open in the second state; wherein on reception of the signal indicating the second state, the switching mechanism is arranged to open the parallel mechanical switch and then open the first switch after a predetermined delay.

4. A current limiting interrupter comprising:

the AC switching arrangement according to claim 1; and a control mechanism arranged to detect a fault condition on the AC grid;

wherein on detection of the fault condition, the control mechanism is arranged to send a signal indicating a fault condition to the AC switching arrangement.

5. The current limiting interrupter according to claim 4, wherein on detection of the fault condition clearing, the control mechanism is arranged to send a signal indicating a recovery condition to the AC switching arrangement operable to put it back into the first state; and/or wherein the control mechanism comprises a current sensor arranged to detect a change in grid current which represents a fault condition and/or a fault clearing condition; and/or wherein the control mechanism comprises a voltage sensor arranged to detect a change in grid voltage which represents a fault condition and/or a fault clearing condition; and/or wherein the control mechanism is arranged to detect a fault and/or fault clearing condition on the basis of a received signal from an external device.

* * * * *